(12) United States Patent
More et al.

(10) Patent No.: US 12,550,364 B2
(45) Date of Patent: *Feb. 10, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shahaji B. More, Hsinchu (TW); Cheng-Wei Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 730 days.

This patent is subject to a terminal disclaimer.

(21) Appl. No.: 17/877,970

(22) Filed: Jul. 31, 2022

(65) Prior Publication Data
US 2024/0038858 A1 Feb. 1, 2024

(51) Int. Cl.
*H10D 30/62* (2025.01)
*H01L 21/285* (2006.01)
*H10D 62/13* (2025.01)
*H10D 64/62* (2025.01)
*H10D 84/01* (2025.01)
(Continued)

(52) U.S. Cl.
CPC ... *H10D 30/6219* (2025.01); *H01L 21/28518* (2013.01); *H10D 62/151* (2025.01); *H10D 64/62* (2025.01); *H10D 84/017* (2025.01); *H10D 84/0186* (2025.01); *H10D 84/0193* (2025.01); *H10D 84/038* (2025.01); *H10D 84/853* (2025.01)

(58) Field of Classification Search
CPC ............. H10D 30/6219; H10D 84/017; H10D 84/0186; H10D 30/797; H10D 84/013; H10D 84/0149; H10D 62/151; H10D 84/0193; H10D 84/853; H10D 30/024; H10D 30/62; H10D 84/834; H10D 84/0158; H10D 84/0188; H10D 84/0151
See application file for complete search history.

(56) References Cited

U.S. PATENT DOCUMENTS 9,105,490 B2   8/2015   Wang et al.
9,236,267 B2   1/2016   De et al.
9,236,300 B2   1/2016   Liaw
(Continued)

FOREIGN PATENT DOCUMENTS

TW   202215665 A   4/2022

OTHER PUBLICATIONS

U.S. Appl. No. 17/171,253, filed Feb. 9, 2021.

*Primary Examiner* — Bac H Au
(74) *Attorney, Agent, or Firm* — NZ Carr Law Office

(57) ABSTRACT

A semiconductor device structure, along with methods of forming such, are described. The semiconductor device structure includes a first source/drain epitaxial feature disposed in a first region, and the first source/drain epitaxial feature is asymmetric with respect to a fin. The structure further includes a second source/drain epitaxial feature disposed in the first region, a first dielectric feature disposed between the first source/drain epitaxial feature and the second source/drain epitaxial feature, and a conductive feature disposed over the first and second source/drain epitaxial features and the first dielectric feature.

20 Claims, 27 Drawing Sheets

(51) Int. Cl.
*H10D 84/03* (2025.01)
*H10D 84/85* (2025.01)

(56) References Cited

U.S. PATENT DOCUMENTS

| | | | |
|---|---|---|---|
| 9,406,804 B2 | 8/2016 | Huang et al. | |
| 9,443,769 B2 | 9/2016 | Wang et al. | |
| 9,455,331 B1 * | 9/2016 | Cai | H10D 30/0243 |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 11,581,411 B2 * | 2/2023 | More | H10D 84/0188 |
| 12,027,597 B2 * | 7/2024 | More | H01L 21/28518 |
| 2019/0067444 A1 * | 2/2019 | Ching | H10D 84/017 |
| 2019/0148551 A1 | 5/2019 | More et al. | |
| 2020/0058649 A1 * | 2/2020 | Ching | H01L 21/76224 |
| 2020/0176560 A1 * | 6/2020 | Yu | H10D 64/017 |
| 2021/0408286 A1 | 12/2021 | More et al. | |
| 2022/0230925 A1 * | 7/2022 | More | H10D 84/038 |
| 2023/0119286 A1 * | 4/2023 | More | H10D 84/0151 |
| | | | 257/288 |
| 2023/0326799 A1 * | 10/2023 | More | H10D 30/024 |
| | | | 257/384 |
| 2023/0395721 A1 * | 12/2023 | More | H10D 84/017 |
| 2024/0072055 A1 * | 2/2024 | More | H10D 62/151 |

\* cited by examiner

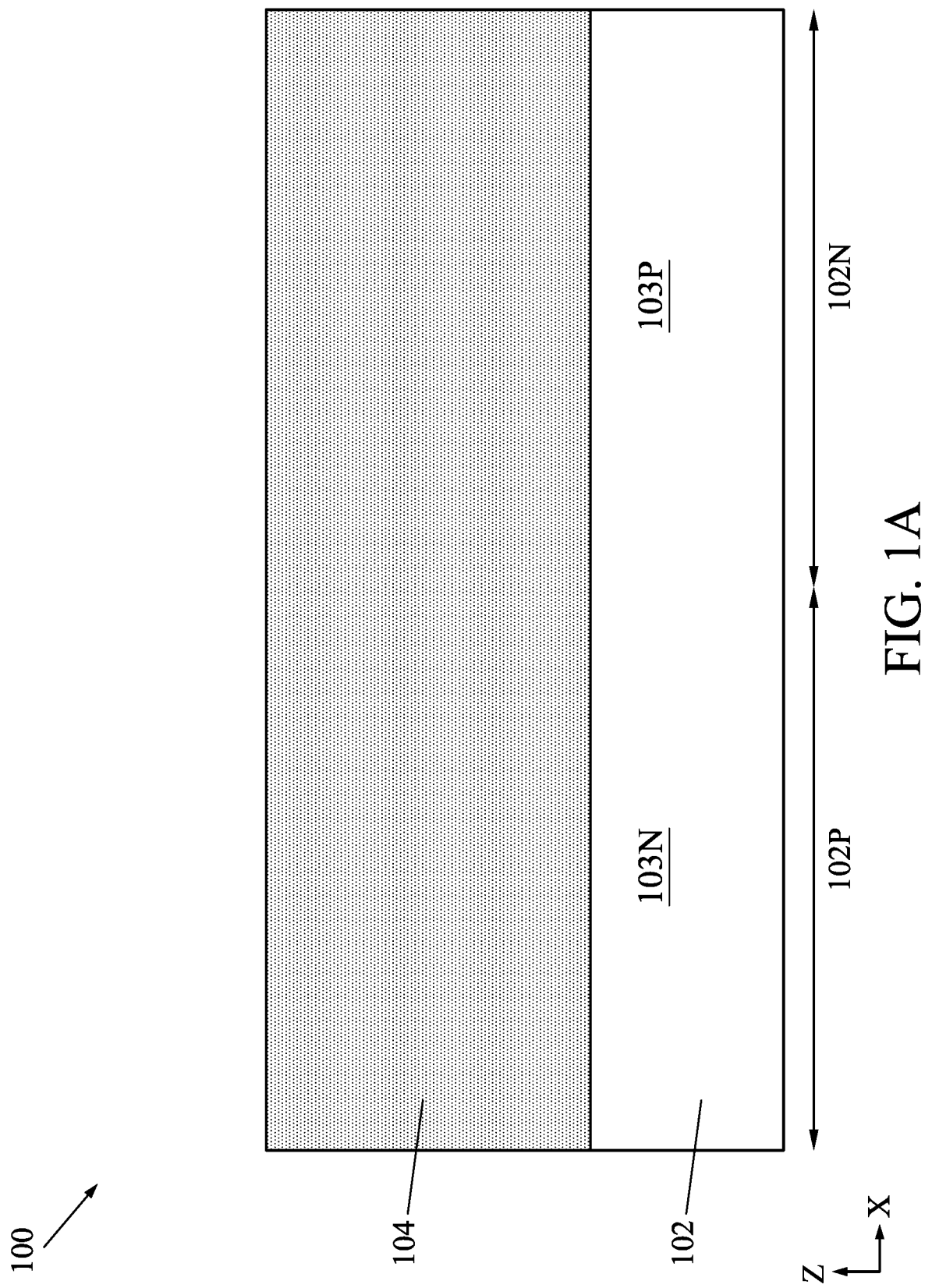

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size decreases, semiconductor devices, such as fin field-effect transistors (FinFETs), may be negatively impacted by the short channel effect and increased source/drain electron tunneling. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1F are cross-sectional side views of various stages of manufacturing a semiconductor device structure, in accordance with some embodiments.

FIGS. 2A-5A are cross-sectional side views of various stages of manufacturing the semiconductor device structure of FIG. 2B taken along line A-A, in accordance with some embodiments.

FIGS. 2B-5B are cross-sectional side views of various stages of manufacturing the semiconductor device structure of FIG. 2B taken along line B-B, in accordance with some embodiments.

DETAILED DESCRIPTION

Figure 1B:
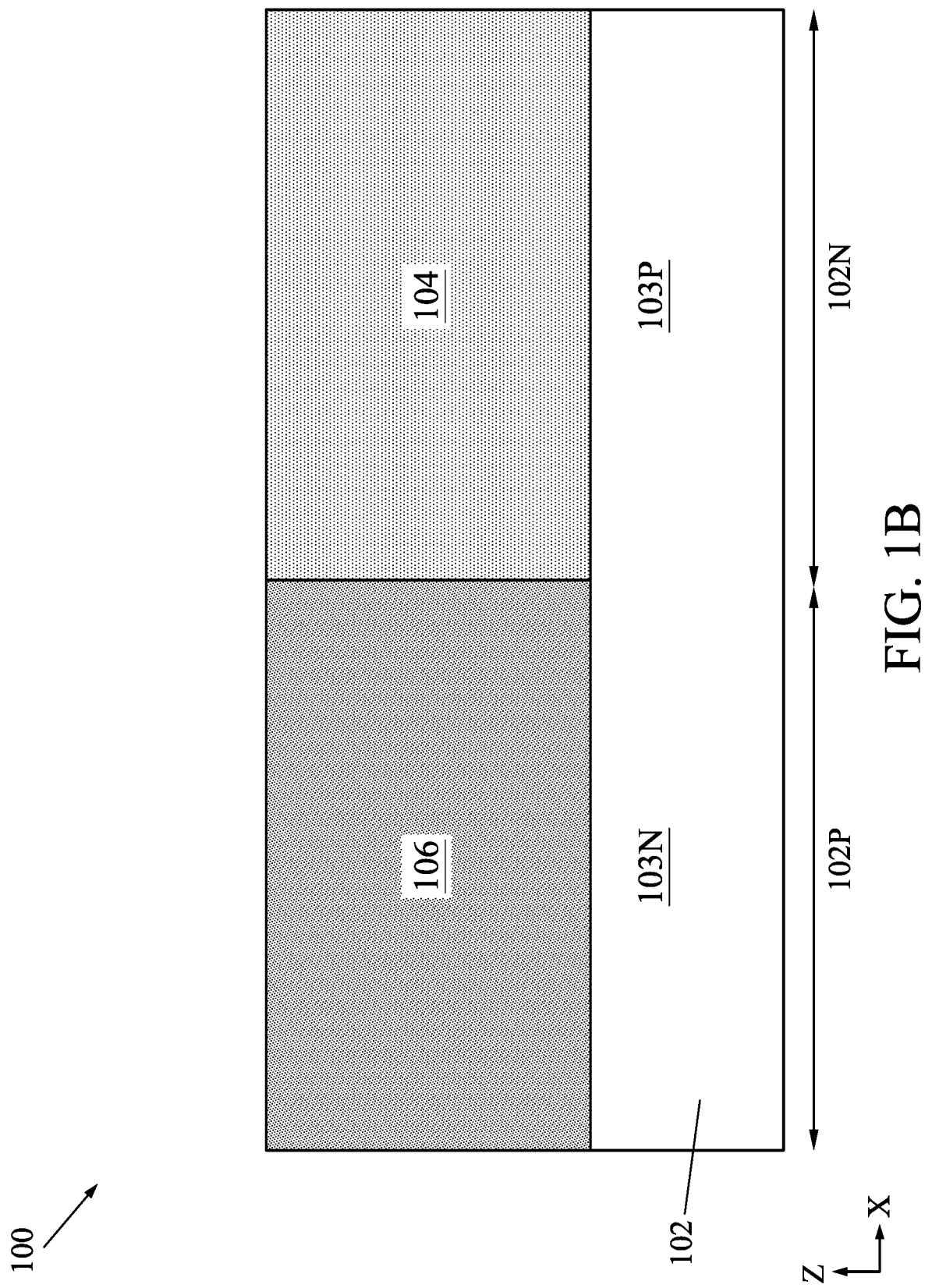

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-10B show exemplary sequential processes for manufacturing a semiconductor device structure 100, in accordance with some embodiments. It is understood that additional operations can be provided before, during, and after processes shown by FIGS. 1A-10B and some of the operations described below can be replaced or eliminated, for additional embodiments of the method. The order of the operations/processes may be interchangeable.

FIGS. 1A-1F are cross-sectional side views of various stages of manufacturing a semiconductor device structure 100, in accordance with some embodiments. As shown in FIG. 1A, a first semiconductor layer 104 is formed on a substrate 102. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1A. In some embodiments, the N-well region 103N is formed in the substrate 102 in the PMOS region 102P, whereas the P-well region 103P is formed in the substrate 102 in the NMOS region 102N, as shown in FIG.

1A. In some embodiments, separate ion implantation processes are performed to form the P-well region 103P and the N-well region 103N. By using two different implantation mask layers (not shown), the P-well region 103P and the N-well region 103N are sequentially formed in different ion implantation processes.

The first semiconductor layer 104 is deposited over the substrate 102, as shown in FIG. 1A. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable process.

As shown in FIG. 1B, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 is formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P. Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. Other types of semiconductor devices may be utilized, such as nanosheet transistors, planar FETs, complementary FETs (CFETs), forksheet FETs, or other suitable devices.

Figure 1C:
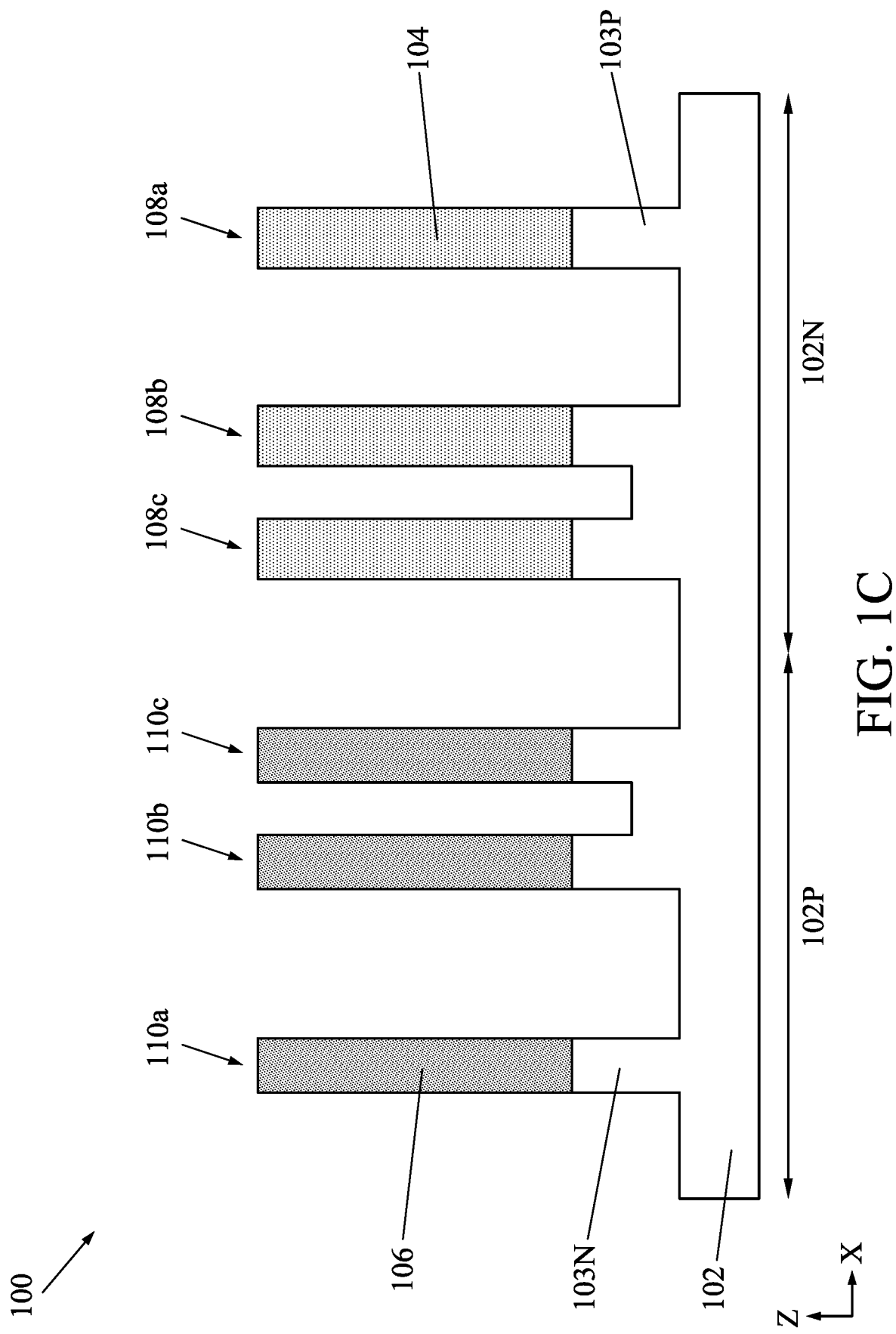

As shown in FIG. 1C, a plurality of fins 108a, 108b, 108c, 110a, 110b, 110c are formed. The fins 108a, 108b, 108c, 110a, 110b, 110c may be patterned by any suitable method. For example, the fins 108a, 108b, 108c, 110a, 110b, 110c may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the fins.

The fins 108a, 108b, 108c may each include the first semiconductor layer 104, and a portion of the first semiconductor layer 104 may serve as an NMOS channel. Each fin 108a, 108b, 108c may also include the P-well region 103P. The fins 110a, 110b, 110c may each include the second semiconductor layer 106, and a portion of the second semiconductor layer 106 may serve as a PMOS channel. Each fin 110a, 110b, 110c may also include the N-well region 103N. A mask (not shown) may be formed on the first and second semiconductor layers 104, 106, and may remain on the fins 108a-c and 110a-c. Each fin 108a-c, 110a-c may have a height along the Z-axis ranging from about 30 nm to about 80 nm.

Figure 1D:
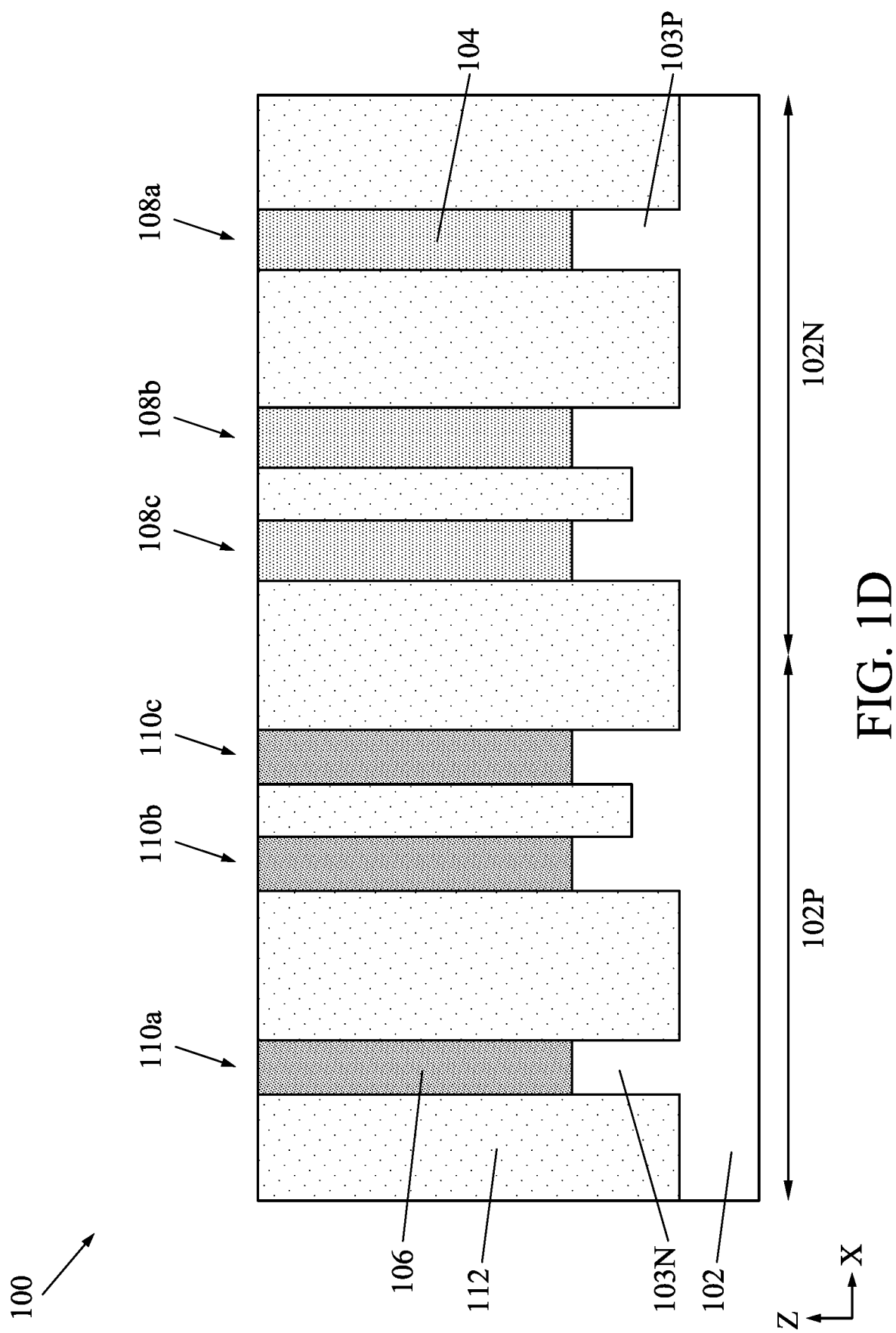

As shown in FIG. 1D, an insulating material 112 is formed between adjacent fins 108a-c, 110a-c. The insulating material 112 may be first formed between adjacent fins 108a-c, 110a-c and over the fins 108a-c, 110a-c, so the fins 108a-c, 110a-c are embedded in the insulating material 112. A planarization process, such as a chemical-mechanical polishing (CMP) process may be performed to expose the top of the fins 108a-c, 110a-c, as shown in FIG. 1D. In some embodiments, the planarization process exposes the top of the mask (not shown) disposed on the fins 108a-c and 110a-c. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD).

Figure 1E:
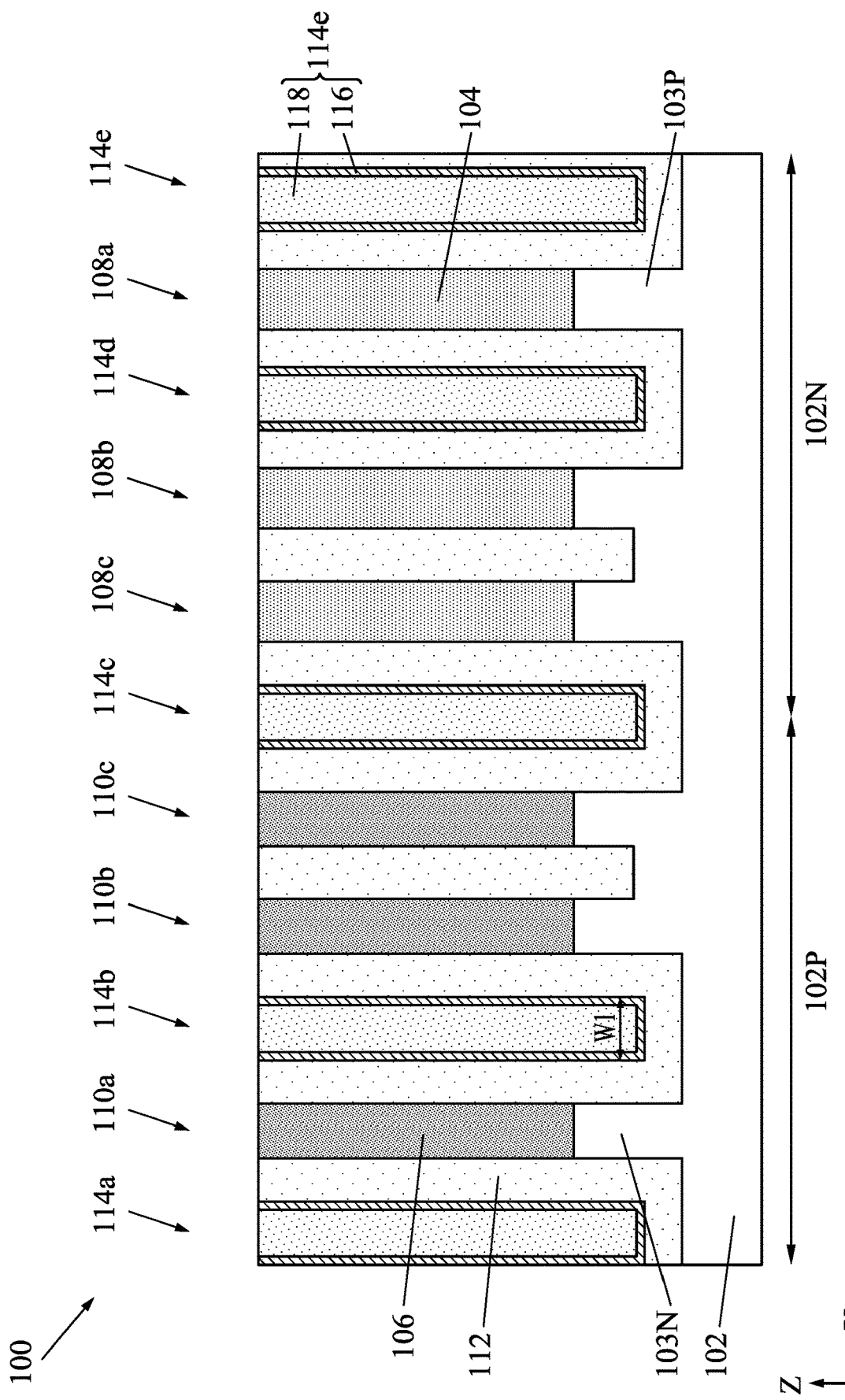

As shown in FIG. 1E, a plurality of dielectric features 114a, 114b, 114c, 114d, 114e are formed in the insulating material 112. In some embodiments, each dielectric feature 114a, 114b, 114c, 114d, 114e may include a liner 116 and a low-K dielectric material 118. The liner 116 may include a dielectric material such as $SiO_2$, SiN, SiCN, SiOC, SiOCN, or other suitable dielectric material. In some embodiments, the liner 116 includes SiCN. The liner 116 may be formed by a conformal process, such as an ALD process. The low-K dielectric material 118 may be formed on the liner 116 and between adjacent fins 108a-c, 110a-c. The low-K dielectric material 118 may include silicon, oxygen, hydrogen, and/or combinations thereof. The low-K dielectric material 118 may have a K value less than about 3.5. The low-K dielectric material 118 may be formed by any suitable process, such as CVD or FCVD. The dielectric features 114a-e may be dielectric fins that separate subsequently formed source/drain (S/D) epitaxial features and electrode layers. In some embodiments, each dielectric feature 114a-e has a width W1 ranging from about 10 nm to about 30 nm. In some embodiments, the dielectric features 114a-e may have a height along the Z-axis greater than, equal to, or less than a height of the fins 108a-c, 110a-c.

Figure 1F:
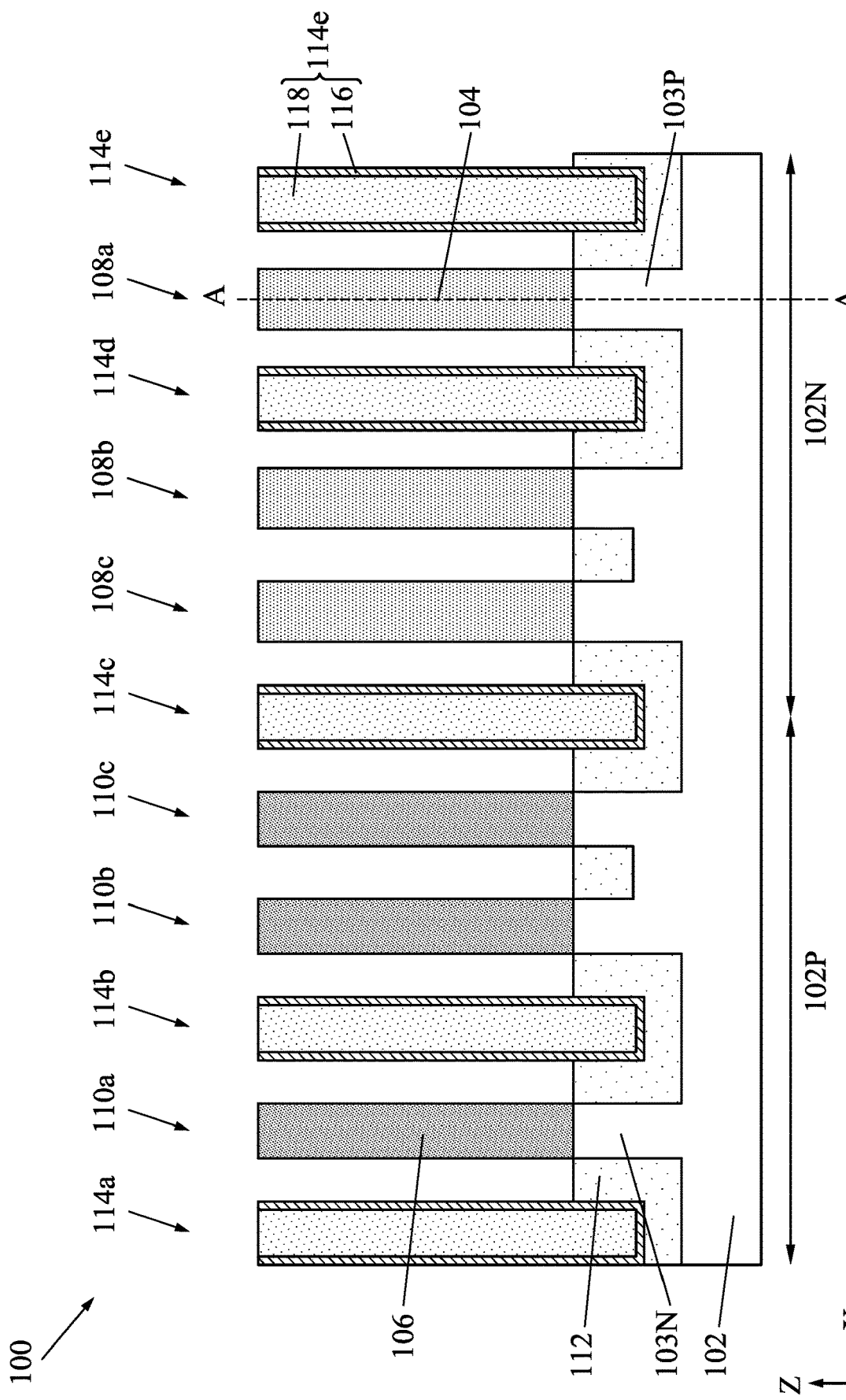

As shown in FIG. 1F, the insulating material 112 may be recessed by removing a portion of the insulating material 112 located on both sides of each fin 108a-c, 110a-c. The insulating material 112 may be recessed by any suitable removal process, such as dry etch or wet etch that selectively removes the insulating material 112 but does not substantially affect the semiconductor materials of the fins 108a-c, 110a-c, the liner 116, and the low-K dielectric material 118. The recessed insulating material 112 may be the shallow trench isolation (STI).

Figure 2A:
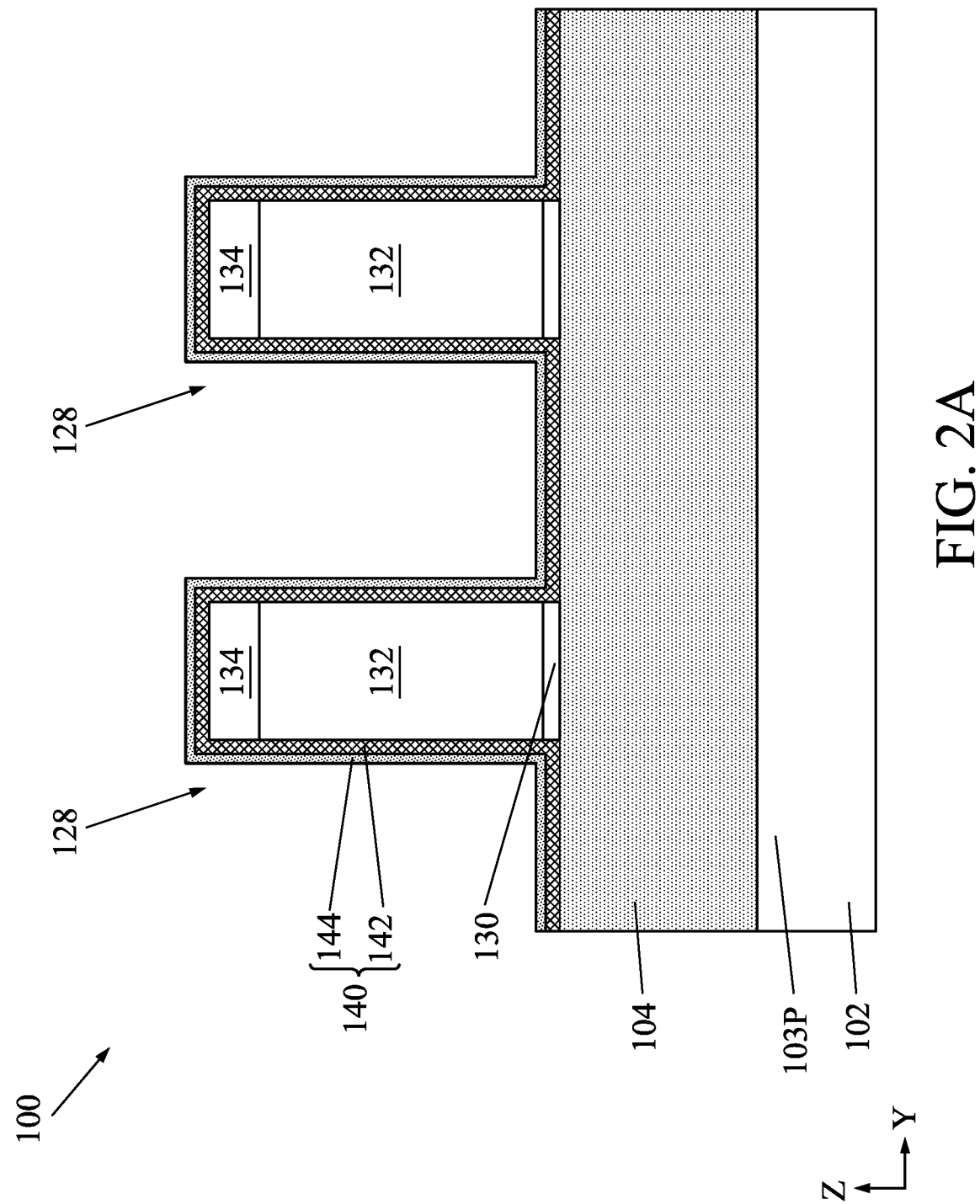

FIGS. 2A-5A are cross-sectional side views of various stages of manufacturing the semiconductor device structure 100 of FIG. 1F taken along line A-A, in accordance with some embodiments. FIGS. 2B-5B are cross-sectional side views of various stages of manufacturing the semiconductor device structure 100, in accordance with some embodiments. As shown in FIGS. 2A and 2B, one or more sacrificial gate stacks 128 are formed on a portion of the fins 108a-c, 110a-c and dielectric features 114a-e, and a spacer 140 is formed on the sacrificial gate stacks 128, the exposed portions of the dielectric features 104a-e, the exposed portions of the second semiconductor layer 106, the exposed portions of the first semiconductor layer 104, and the insulating material 112. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 includes a material different from that of the insulating material 112. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-c, 110a-c are partially exposed on opposite sides of the sacrificial gate stacks 128. As illustrated in FIG. 2A, two sacrificial gate stacks 128 are formed, which is for illustrative purpose and not intended to be limiting beyond what is specifically recited in the claims. It can be appreciated that any number of the sacrificial gate stacks 128 may be formed. The sacrificial gate stacks 128 may also cover a portion of each of the dielectric features 104a-e, and the dielectric features 104a-e are partially exposed on opposite sides of the sacrificial gate stacks 128.

Figure 2B:
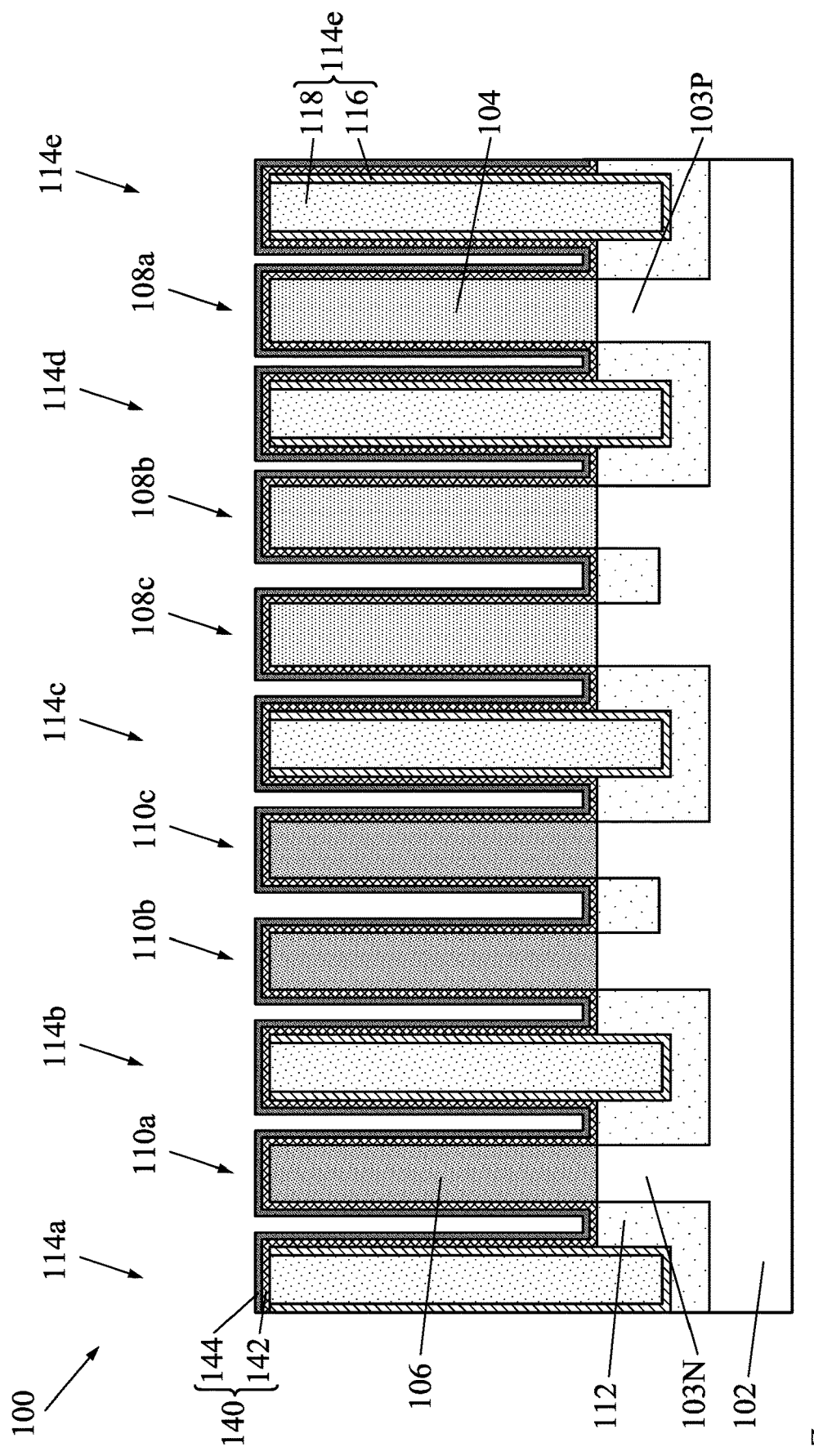

In some embodiments, the spacer 140 includes a first layer 142 and a second layer 144, as shown in FIGS. 2A and 2B. The first and second layers 142, 144 may be conformally deposited on the exposed surfaces of the semiconductor device structure 100. The conformal first and second layers 142, 144 may be formed by ALD processes. The first and second layers 142, 144 may be made of a dielectric material such as silicon oxide, silicon nitride, silicon carbide, silicon oxynitride, SiCN, silicon oxycarbide, SiOCN, and/or combinations thereof. In some embodiments, the first and second layers 142, 144 include different materials. In some embodiments, the spacer 140 is a single layer. In some embodiments, the spacer 140 includes more than two layers. As shown in FIG. 2B, the spacer 140 is also formed on the exposed portions of the second semiconductor layer 106 and the dielectric features 104a-e.

Figure 3A:
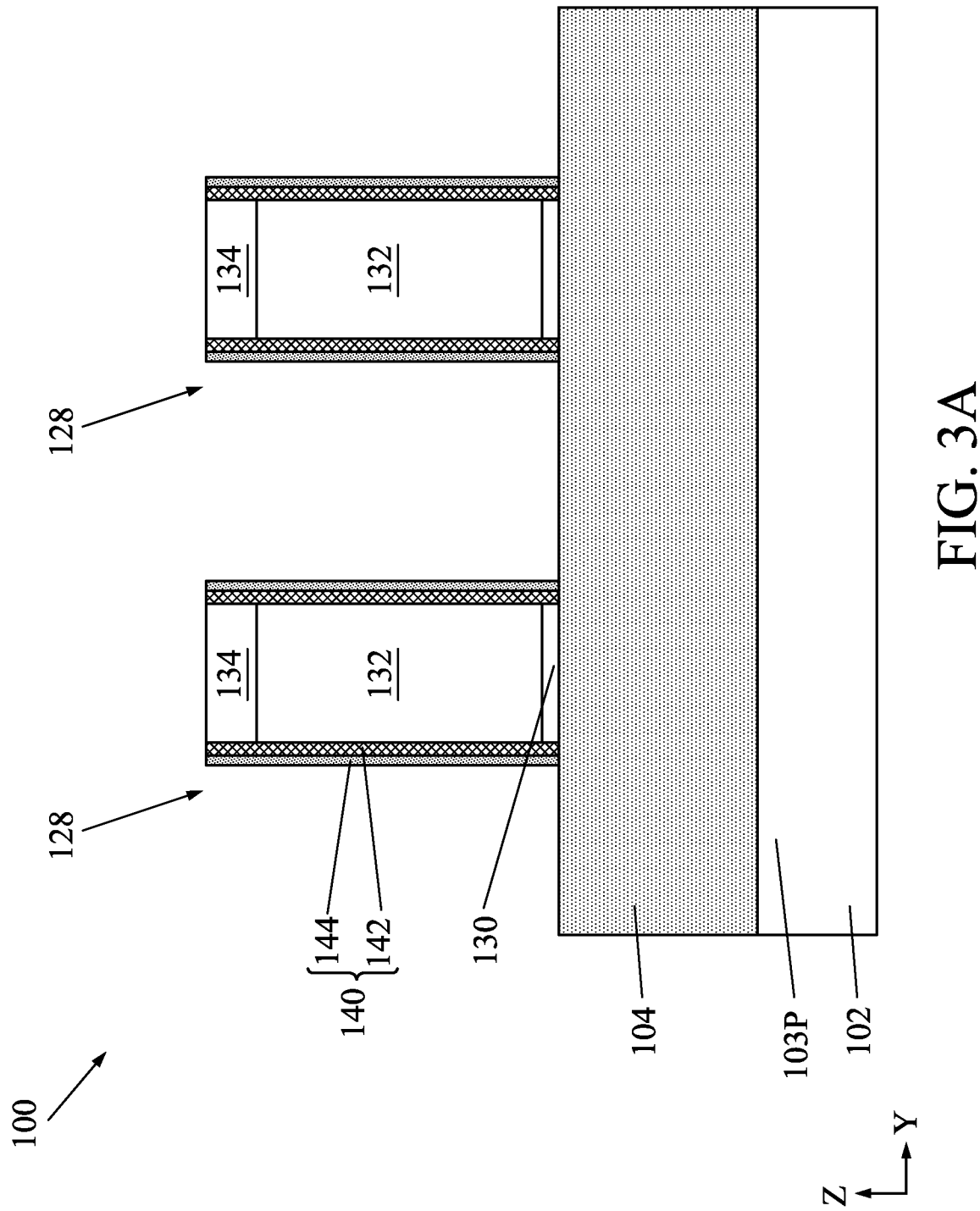
Figure 3B:
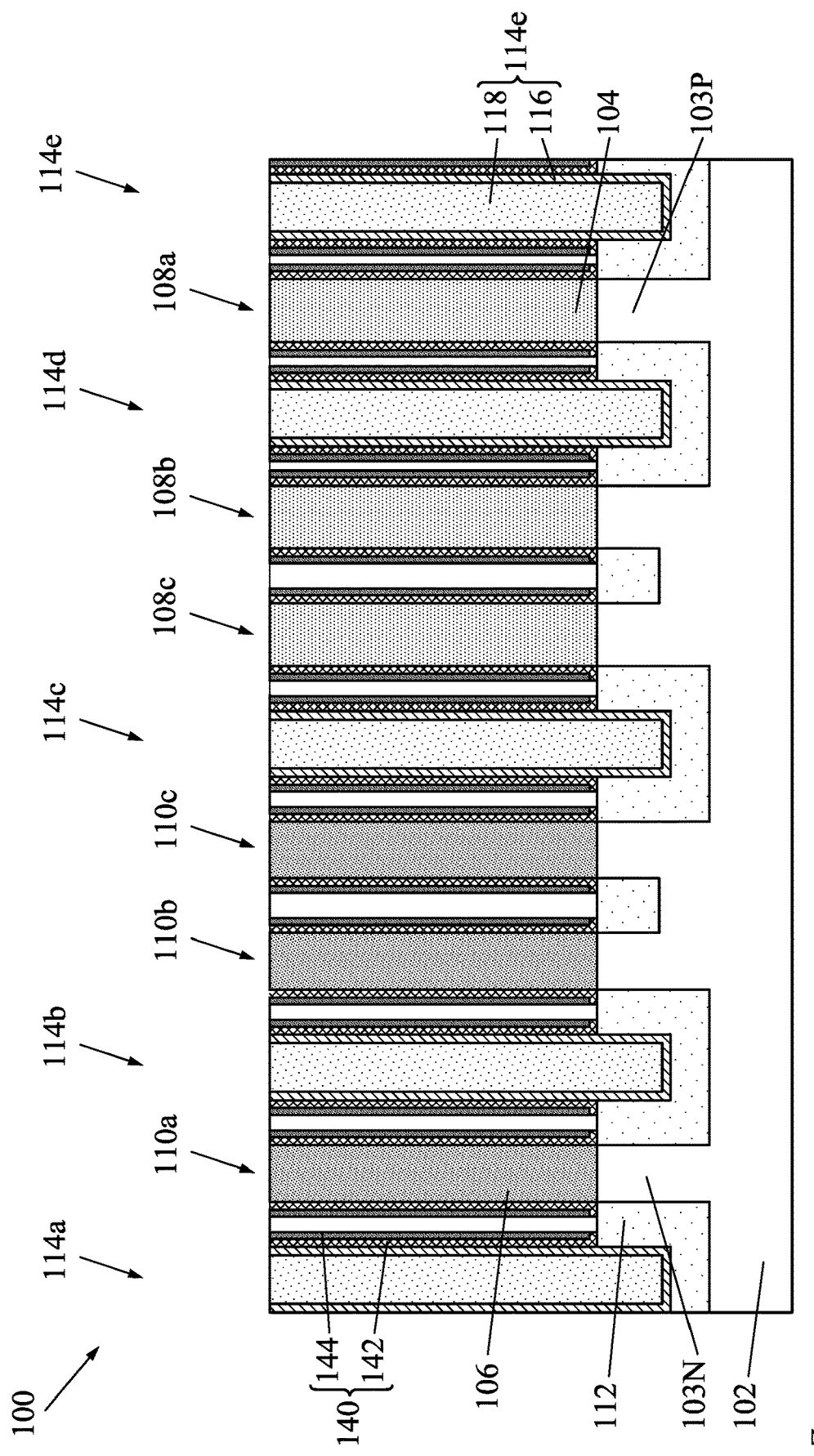

As shown in FIGS. 3A and 3B, an anisotropic etch is performed on the spacer 140 using, for example, RIE. During the anisotropic etch process, most of the spacer 140 is removed from horizontal surfaces, such as tops of the sacrificial gate stacks 128, tops of the fins 108a-c, 110a-c, and tops of the dielectric features 114a-e, leaving the spacer 140 on the vertical surfaces, such as the sidewalls of sacrificial gate stacks 128, sidewalls of the fins 108a-c, 110a-c, and sidewalls of the dielectric features 114a-e.

Figure 4A:
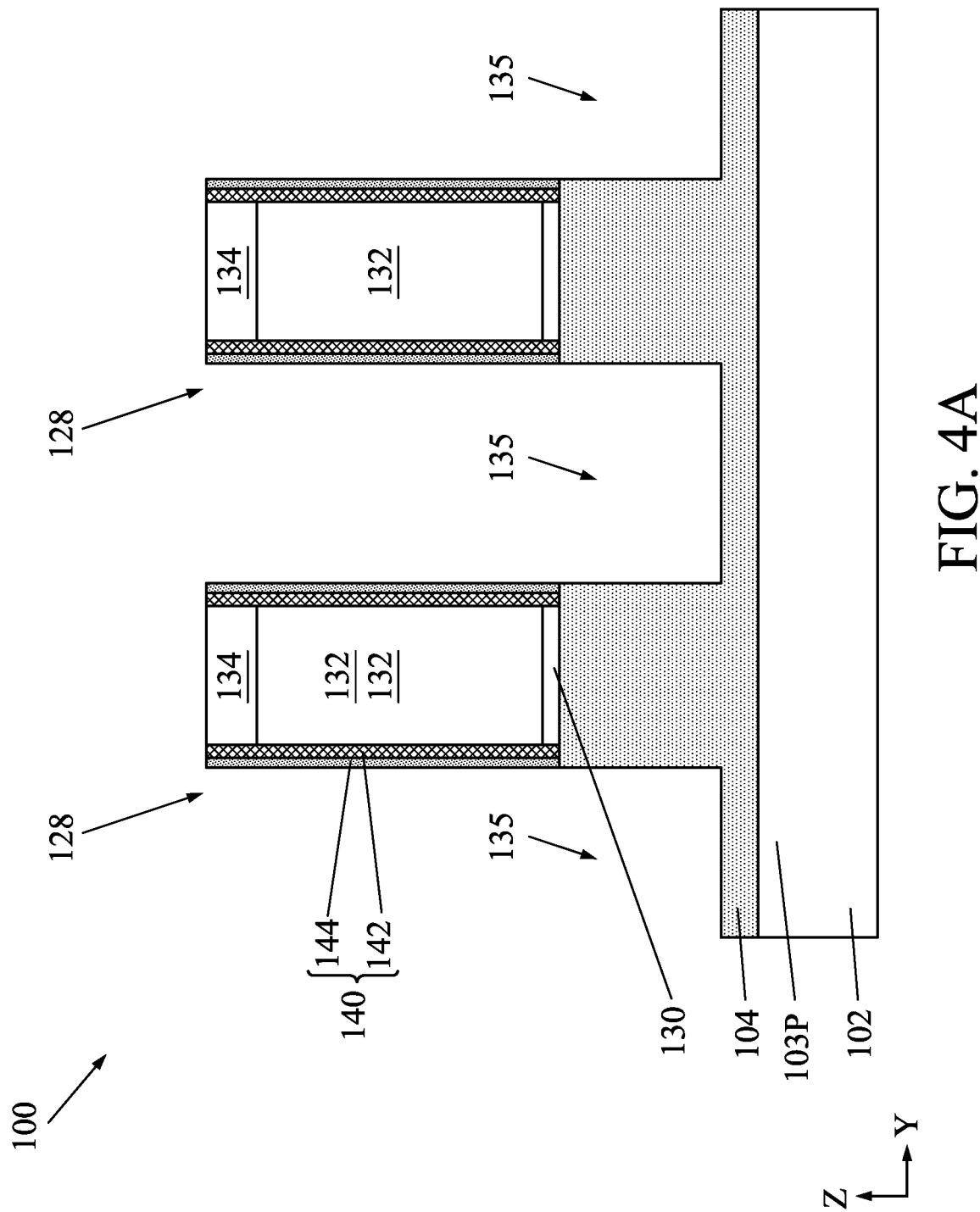
Figure 4B:
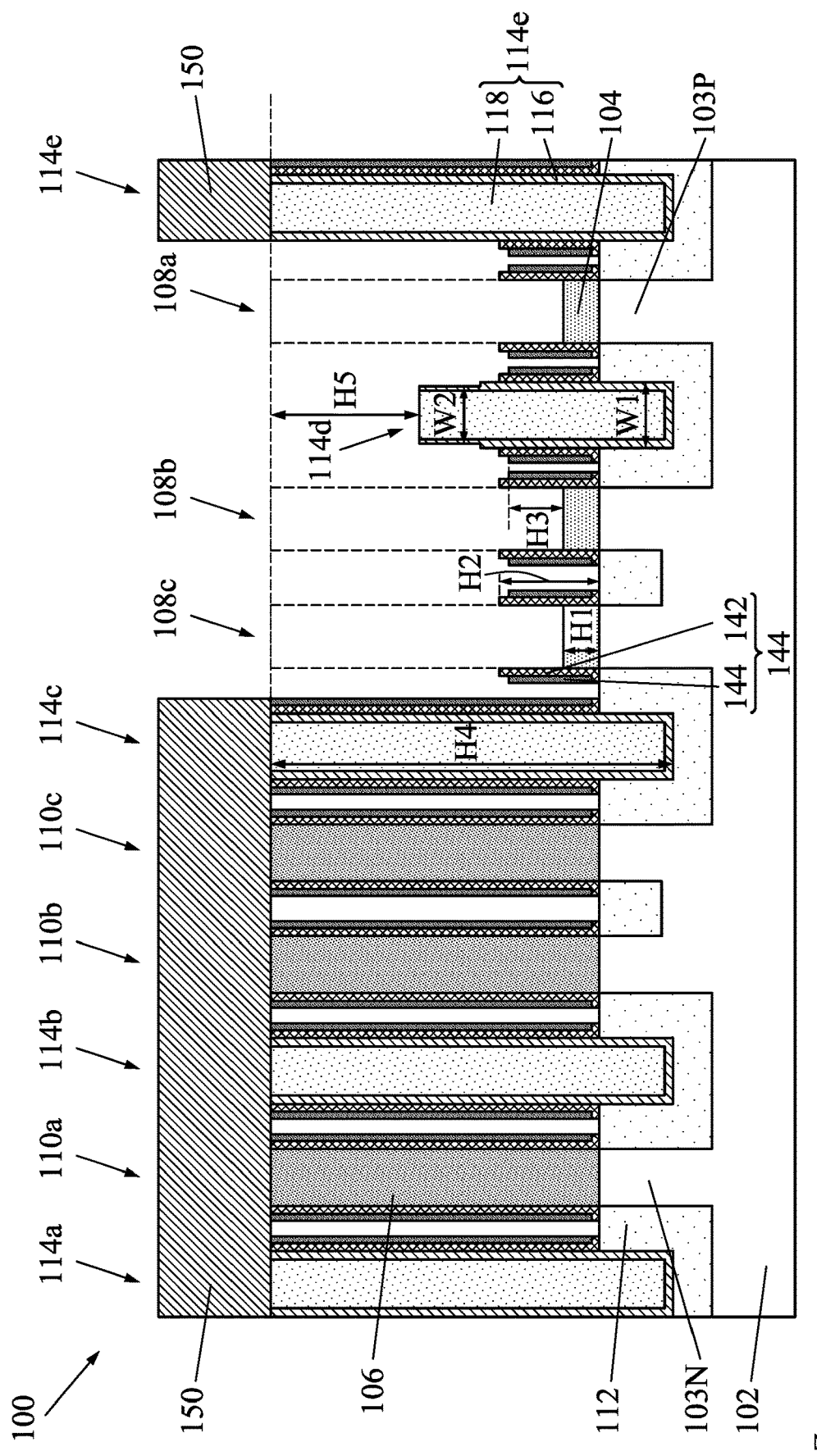

As shown in FIGS. 4A and 4B, a mask 150 is formed on the PMOS region 102P and on the dielectric feature 114e which may separate the NMOS region 102N from another PMOS region 102P (not shown), and the exposed materials not covered by the sacrificial gate stacks 128 and the mask 150, such as exposed portions of the fins 108a-c, the dielectric feature 114d, and the spacer 140 disposed on the sidewalls of the fins 108a-c and the dielectric feature 114d are recessed to form openings 135. A sacrificial liner (not shown) may be formed on the PMOS region 102P and the dielectric feature 114e, and the mask 150 is formed on the sacrificial liner. The mask 150 may be a patterned photoresist layer. As shown in FIG. 4B, the fins 108a-c covered by the sacrificial gate stacks 128 are shown in dotted lines. The recess of the materials may be performed by multiple etch processes. For example, a first etch process is performed to recess the spacer 140, a second etch process is performed to recess the fins 108a-c, and a third etch process is performed to recess the dielectric feature 114d. The recessing of the spacer 140, the fins 108a-c, and the dielectric feature 114d may be performed in any suitable order. In some embodiments, the first etch process is a selective etch process that recesses the spacer 140 but not the other materials of the semiconductor device structure 100, the second etch process is a selective etch process that recesses the fins 108a-c but not the other materials of the semiconductor device structure 100, and the third etch process is a selective etch process that recesses the dielectric feature 114d but not the other materials of the semiconductor device structure 100. In some embodiments, the three selective etch processes are plasma etch processes. Separate selective etch processes to recess the features lead to improved controlling of the dimensions of the resulting features.

Figure 5A:
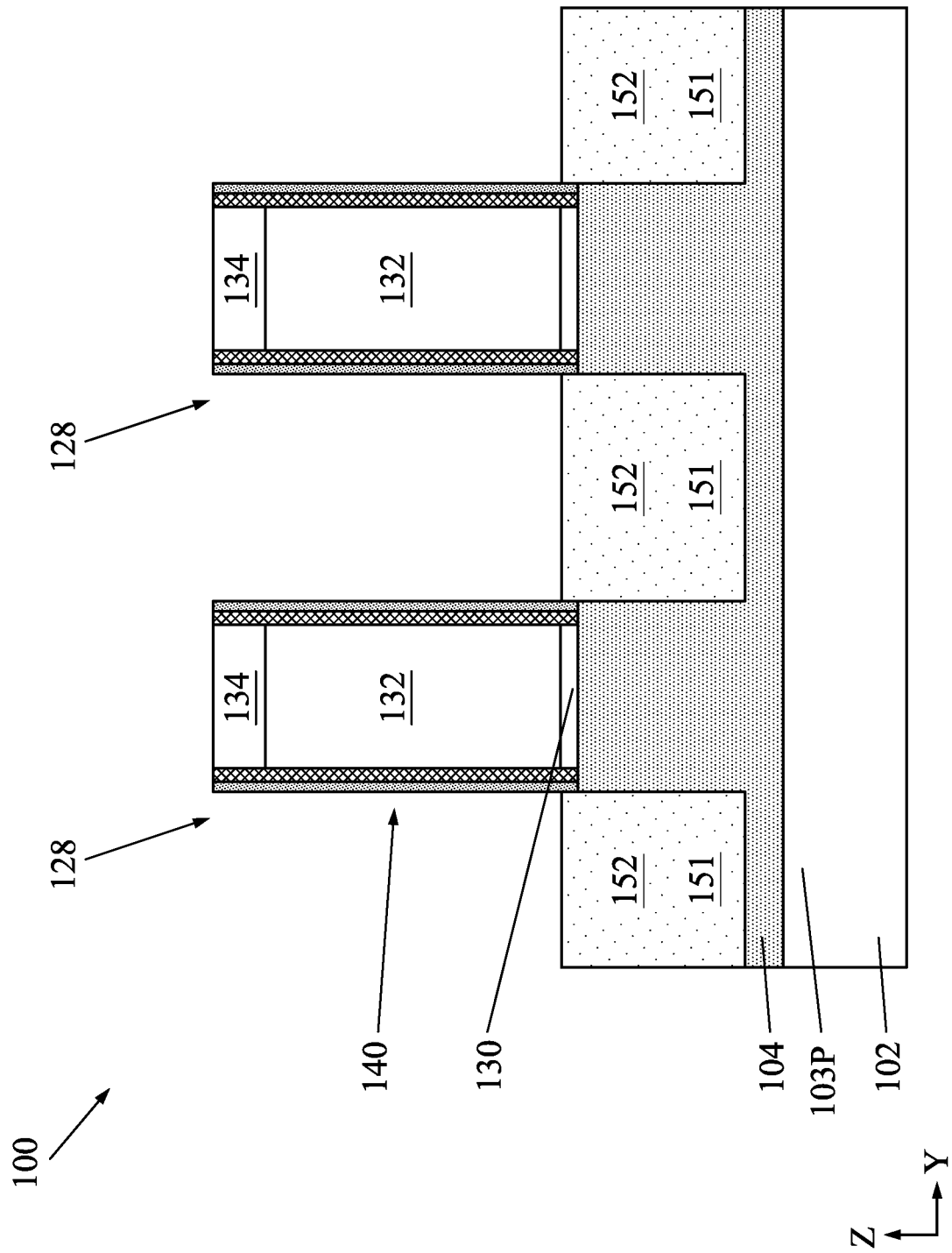
Figure 5B:
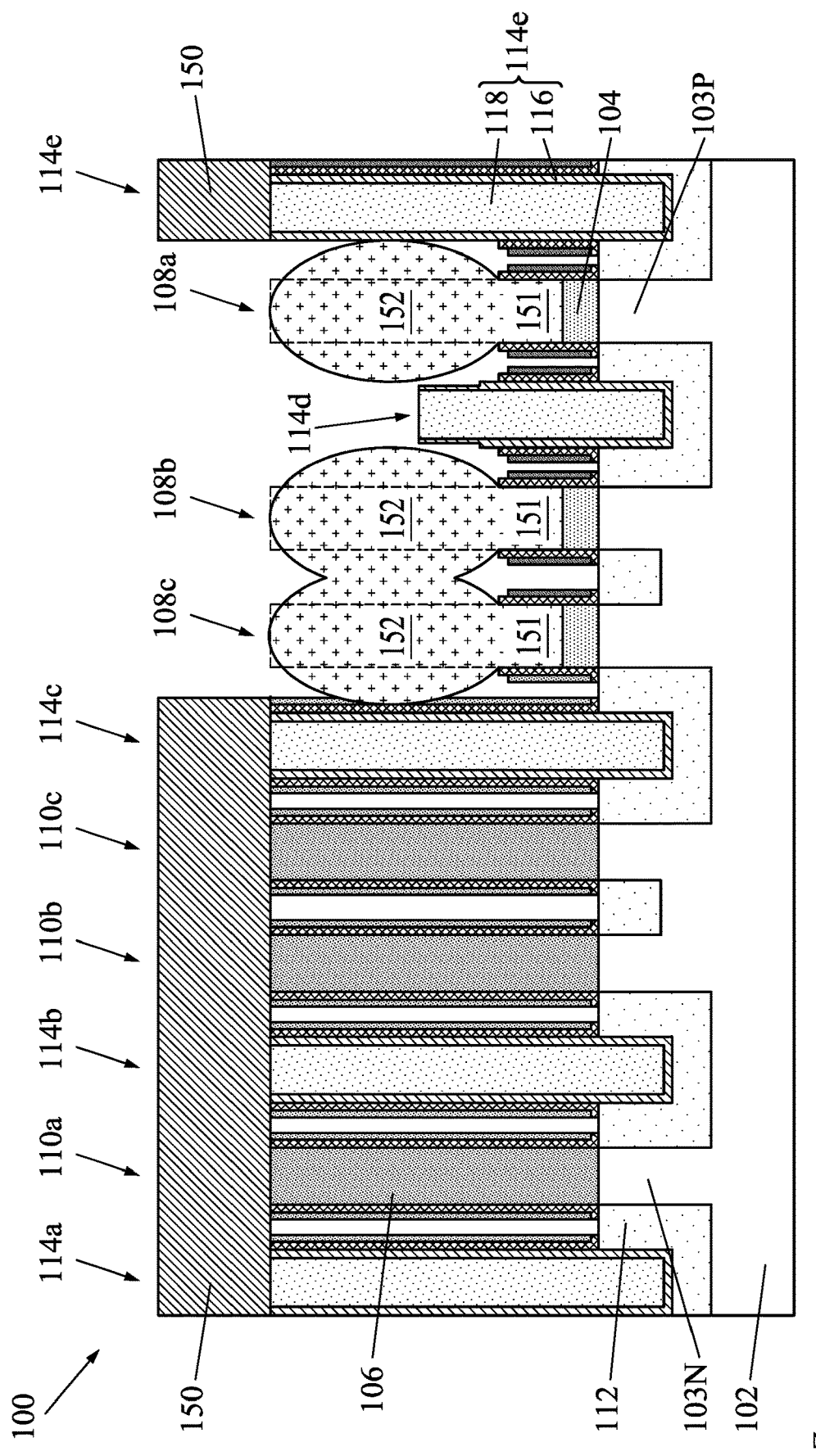

In some embodiments, the remaining fins 108a-c has a height H1 ranging from about 5 nm to about 10 nm. The remaining first layer 142 has a height H2 ranging from about 15 nm to about 20 nm, and the remaining second layer 144 has a height H3 ranging from about 10 nm to about 15 nm. In some embodiments, the difference between the height H3 and the height H4 ranges from about 1 nm to about 5 nm in order to control the shape of the subsequently formed S/D epitaxial features 152 (FIGS. 5A and 5B). The initial dielectric feature 114d may have a height H4 ranging from about 30 nm to about 80 nm, and the third etch process removed an amount of the dielectric feature 114d having the height H5. In some embodiments, the height H5 ranging from about 15 nm to about 40 nm. In some embodiments, the height H5 is about 50 percent of less of the height H4 in order to prevent the adjacent S/D epitaxial features 152 (FIGS. 5A and 5B) from merging. In some embodiments, the width of the dielectric feature 114d is decreased from W1 to W2 as a result of the third etch process. The width W2 ranges from about 5 nm to about 15 nm. In some embodiments, the difference between the width W1 and the width W2 ranges from about 5 nm to about 15 nm. The width W2 may be at least 50 percent of the width W1 in order to prevent the adjacent S/D epitaxial features 152 (FIGS. 5A and 5B) from merging. Furthermore, the reduced width W2 can help controlling the width of the S/D epitaxial features 152 (FIGS. 5A and 5B). In some embodiments, the liner 116 of the dielectric feature 114d has a first portion having a first thickness and a second portion disposed below the first portion having a second thickness substantially greater than the first thickness, as shown in FIG. 4B.

As shown in FIGS. 5A and 5B, lightly doped epitaxial layers 151 and the S/D epitaxial features 152 are formed. In some embodiments, each lightly doped epitaxial layers 151 may include SiP or SiAs and each S/D epitaxial features 152 may include one or more layers of Si, SiP, SiC, or SiCP for NMOS devices. In some embodiments, the lightly doped epitaxial layer 151 includes SiP or SiAs doped with phosphorous having a dopant concentration ranging from about 1E20 at/cm$^3$ to about 5E20 at/cm$^3$. The S/D epitaxial feature 152 may include a main layer and a cap layer. In some embodiments, the main layer includes SiP with phosphorous concentration ranging from about 5E20 at/cm$^3$ to about 4E21 at/cm$^3$, and the cap layer includes SiP with phosphorous concentration ranging from about 1E21 at/cm$^3$ to about 2E21 at/cm$^3$. The main layer may have a thickness along the Z axis ranging from about 30 nm to about 60 nm, and the cap layer may have a thickness ranging from about 5 nm to about 10 nm.

The lightly doped layers 151 and the S/D epitaxial features 152 may be formed by any suitable method, such as CVD, CVD epitaxy, MBE, or other suitable method. The lightly doped layers 151 and the S/D epitaxial features 152 may be formed on the remaining portion of the first semiconductor layer 104 of the fins 108a-c on both sides of each sacrificial gate stack 128, as shown in FIGS. 5A and 5B.

In some embodiments, the S/D epitaxial features 152 formed over the remaining portion of the first semiconductor layer 104 of the fins 108b and 108c are merged, as shown in FIG. 5B, and the S/D epitaxial feature 152 formed over the remaining portion of the first semiconductor layer 104 of the fin 108a is separated from the S/D epitaxial feature 152 formed over the remaining portion of the first semiconductor layer 104 of the fin 108b by the dielectric feature 114d. In some embodiments, the two merged S/D epitaxial features 152 and one separate S/D epitaxial feature 152 are part of a ring oscillator (RO) device.

Figure 6:
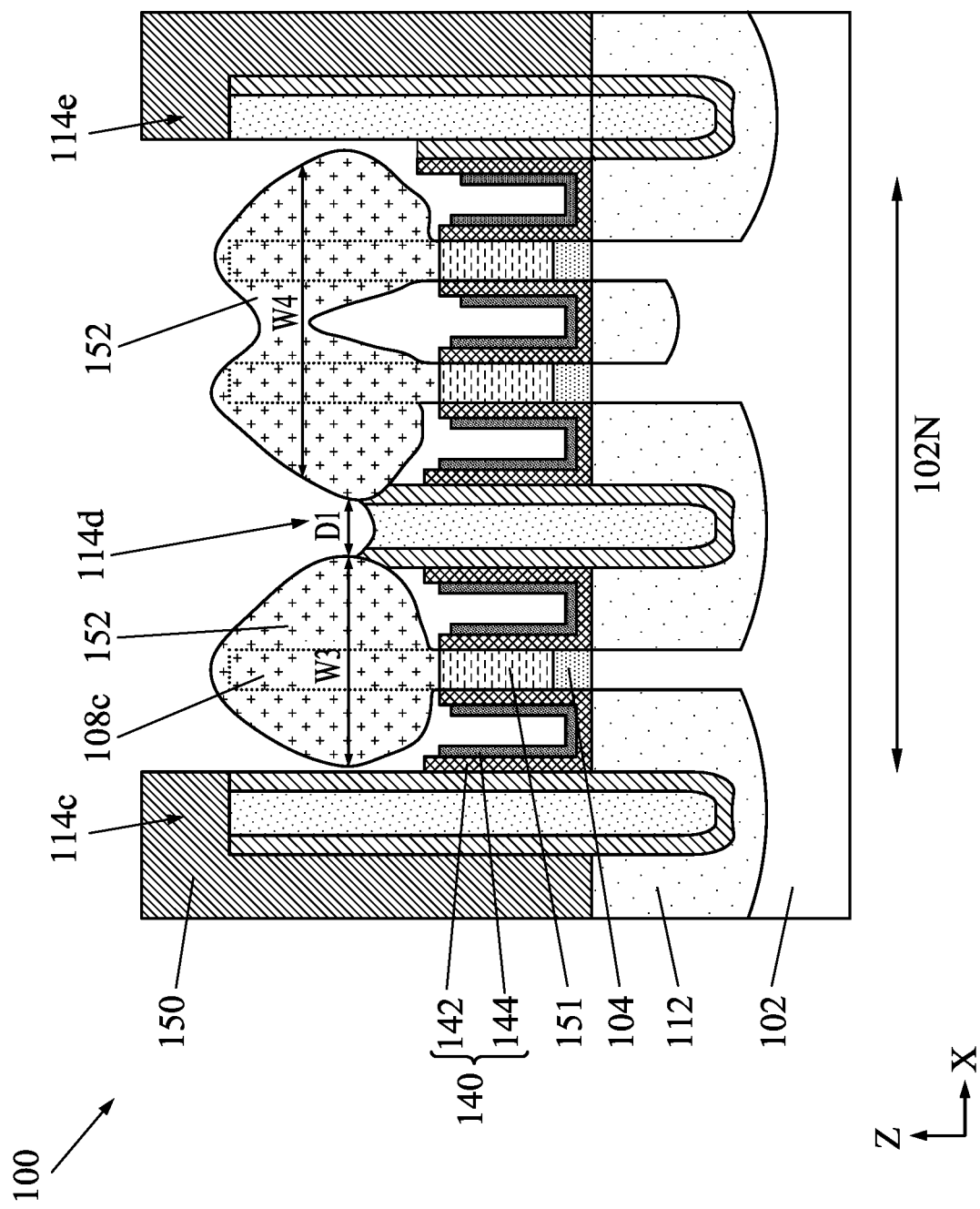
FIG. 6 is a cross-sectional side view of one of various stages of manufacturing the semiconductor device structure, in accordance with some embodiments.

FIG. 6 is a cross-sectional side view of one of various stages of manufacturing the semiconductor device structure 100, in accordance with some embodiments. FIG. 6 illustrates the S/D epitaxial features 152 in the NMOS region 102N according to some embodiments. As shown in FIG. 6, the portions of the spacer 140 located on the insulating material 112 are not removed as a result of being at a bottom of openings, which may be difficult for the etchant to reach, in some embodiments. Due to the recessed dielectric feature 114d, the S/D epitaxial feature 152 may be asymmetric with respect to the fin 108c (located under the sacrificial gate stack 128 and is shown in dotted line) along the Y axis. The single S/D epitaxial feature 152 has a width W3 ranging from about 30 nm to about 50 nm, and the merged S/D epitaxial features 152 has a width W4 ranging from about 50 nm to about 80 nm. In some embodiments, the ratio of the width W4 to the width W3 ranges from about 1.5 to about 2.5. In some embodiments, a distance D1 between the single S/D epitaxial feature 152 and the merged S/D epitaxial feature 152 ranges from about 10 nm to about 25 nm. By recessing the dielectric feature 114d, the distance D1 is reduced, and the widths W3 and W4 are increased, leading to increased metal landing area. As shown in FIG. 6, due to the nature of the material of the S/D epitaxial features 152, the tops of the S/D epitaxial features 152 may be wavy-shaped.

Figure 7A:
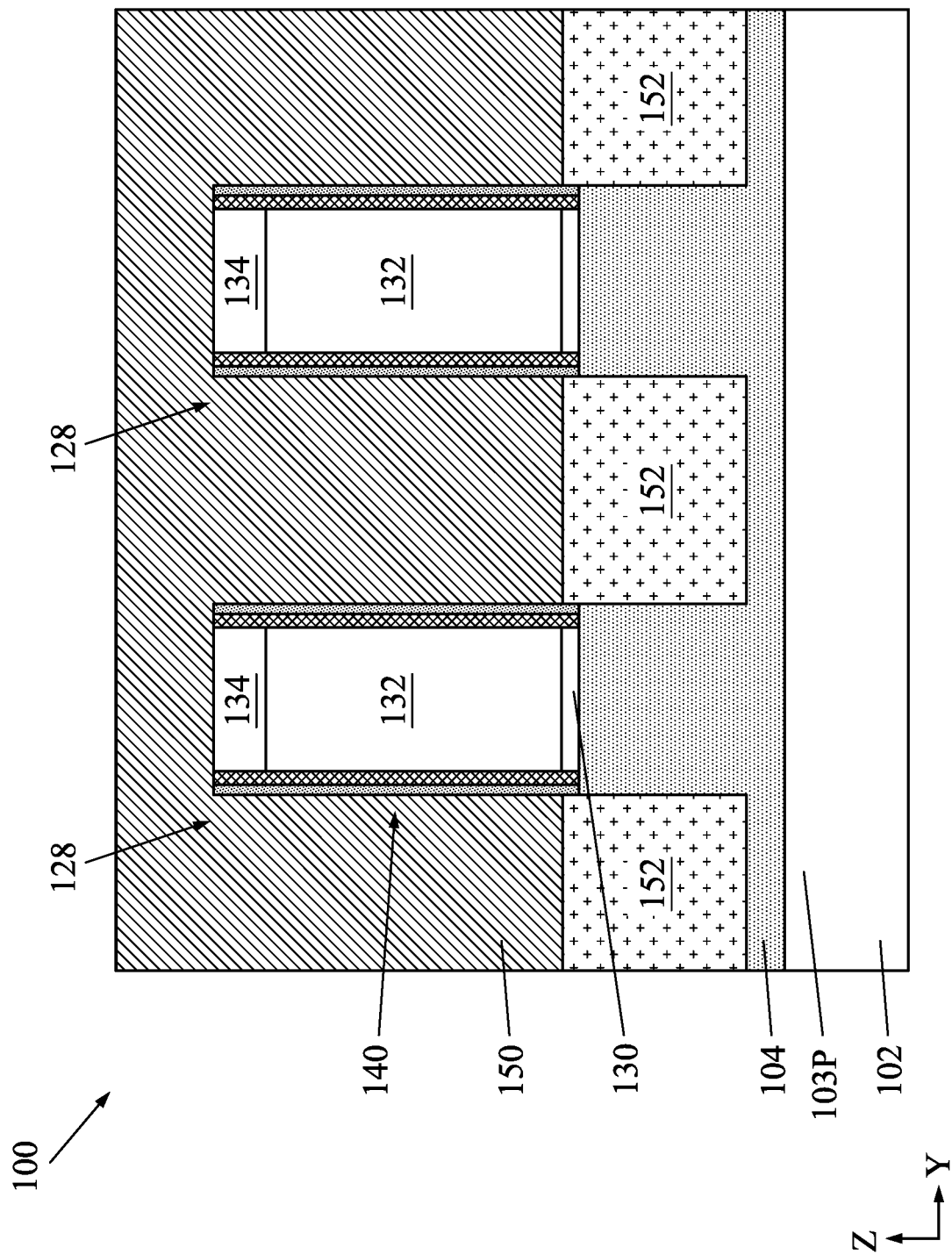
FIGS. 7A and 7B are cross-sectional side views of one of various stages of manufacturing the semiconductor device structure, in accordance with some embodiments.
Figure 7B:
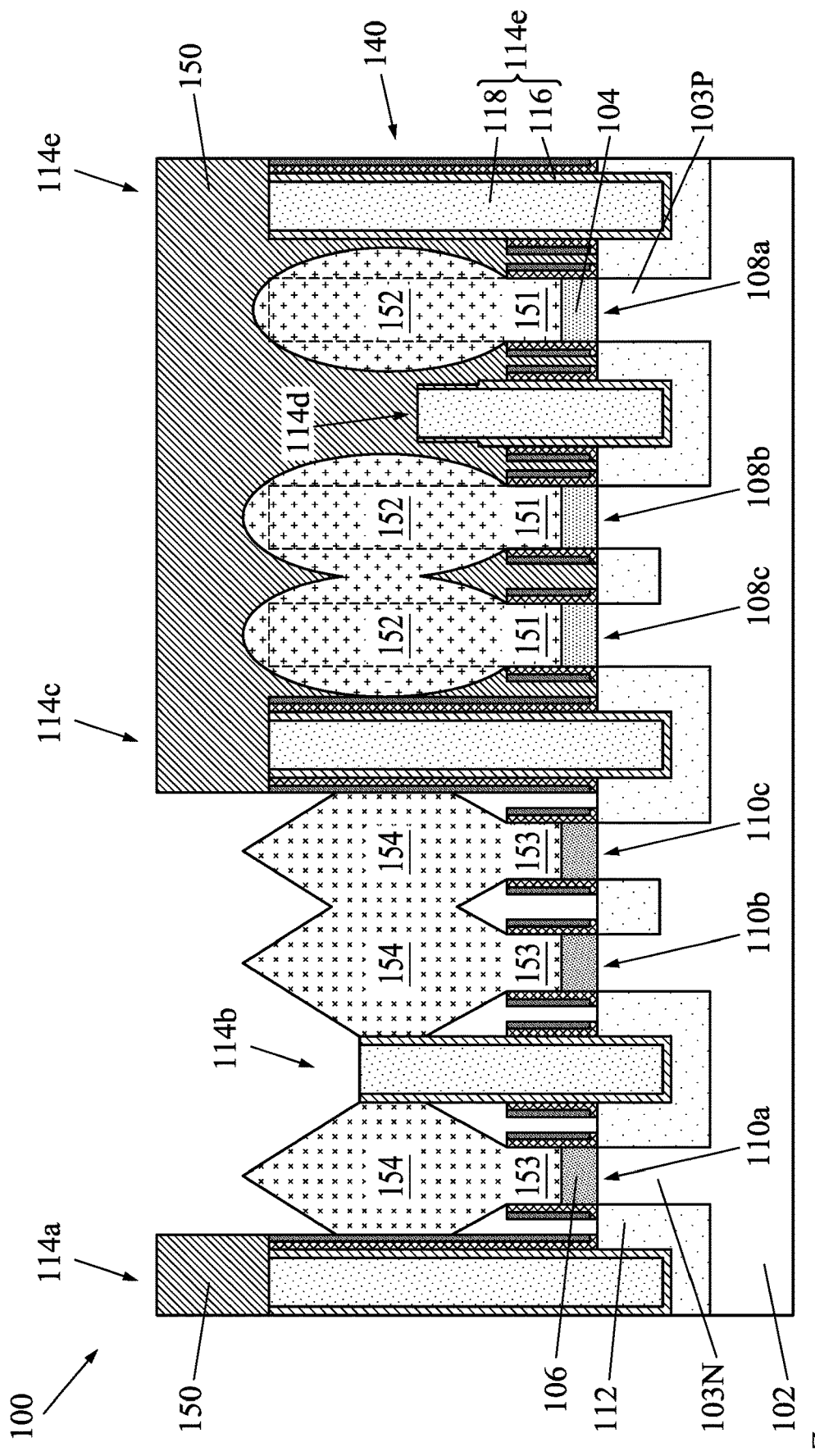

As shown in FIGS. 7A and 7B, the mask 150 formed on the PMOS region 102P is removed to expose the fins 110a-c (FIG. 5B) and the dielectric feature 114b (FIG. 5B), and the mask 150 is formed on the NMOS region 102N and on the dielectric features 114a, 114c, 114e. Next, the exposed materials not covered by the sacrificial gate stacks 128 and the mask 150, such as exposed portions of the fins 110a-c, the dielectric feature 114b, and the spacer 140 disposed on the sidewalls of the fins 110a-c and the dielectric feature 114b, are recessed, as shown in FIGS. 7A and 7B. The recess of the materials may be performed by the same processes described in FIGS. 4A and 4B. For example, a first etch process is performed to recess the spacer 140, a second etch process is performed to recess the fins 110a-c, and a third etch process is performed to recess the dielectric feature 114b. The recessing of the spacer 140, the fins 110a-c, and the dielectric feature 114b may be performed in any suitable order. In some embodiments, the first etch process is a selective etch process that recesses the spacer 140 but not the other materials of the semiconductor device structure 100, the second etch process is a selective etch process that recesses the fins 110a-c but not the other materials of the semiconductor device structure 100, and the third etch process is a selective etch process that recesses the dielectric feature 114b but not the other materials of the semiconductor device structure 100. In some embodiments, the three selective etch processes are plasma etch processes. Separate selective etch processes to recess the features lead to improved controlling of the dimensions of the resulting features. The dimensions of the fins 110a-c, the first layer 142, the second layer 144, and the dielectric feature 114b after the etch processes may have dimensions similar to those of the fins 108a-c, the first layer 142, the second layer 144, and the dielectric feature 114d shown in FIG. 4B.

As shown in FIGS. 7A and 7B, lightly doped epitaxial layers 153 and S/D epitaxial features 154 are formed. In some embodiments, each lightly doped epitaxial layers 153 may include SiGe:B and each S/D epitaxial features 154 may include one or more layers of Si, SiGe, or Ge for PMOS devices. In some embodiments, the lightly doped epitaxial layer 153 includes boron doped SiGe with a dopant concentration ranging from about 1E20 at/cm$^3$ to about 8E20 at/cm$^3$. The germanium concentration may range from about 15 atomic percent to about 35 atomic percent. The S/D epitaxial feature 154 may include a main layer and a cap layer. In some embodiments, the main layer includes boron doped SiGe with boron concentration ranging from about 8E20 at/cm$^3$ to about 3E21 at/cm$^3$, and the germanium concentration of the main layer ranges from about 35 atomic percent to about 55 atomic percent. The cap layer includes boron doped SiGe with boron concentration ranging from about 1E21 at/cm$^3$ to about 2E21 at/cm$^3$, and the germanium concentration of the cap layer ranges from about 45 atomic percent to about 55 atomic percent. The main layer may have a thickness along the Z axis ranging from about 30 nm to about 60 nm, and the cap layer may have a thickness ranging from about 5 nm to about 10 nm.

The lightly doped epitaxial layers 153 and the S/D epitaxial features 154 may be formed by any suitable method, such as CVD, CVD epitaxy, MBE, or other suitable method. The lightly doped epitaxial layers 153 and the S/D epitaxial features 154 may be formed on the remaining portion of the second semiconductor layer 106 of the fins 110a-c on both sides of each sacrificial gate stack 128, as shown in FIGS. 7A and 7B.

In some embodiments, the S/D epitaxial features 154 formed over the remaining portion of the second semiconductor layer 106 of the fins 110b and 110c are merged, as shown in FIG. 7B, and the S/D epitaxial feature 154 formed over the remaining portion of the second semiconductor layer 106 of the fin 110a is separated from the S/D epitaxial feature 152 formed over the remaining portion of the second semiconductor layer 106 of the fin 110b by the dielectric feature 114b. In some embodiments, the two merged S/D epitaxial features 154 and one separate S/D epitaxial feature 154 are part of an RO device.

Figure 8:
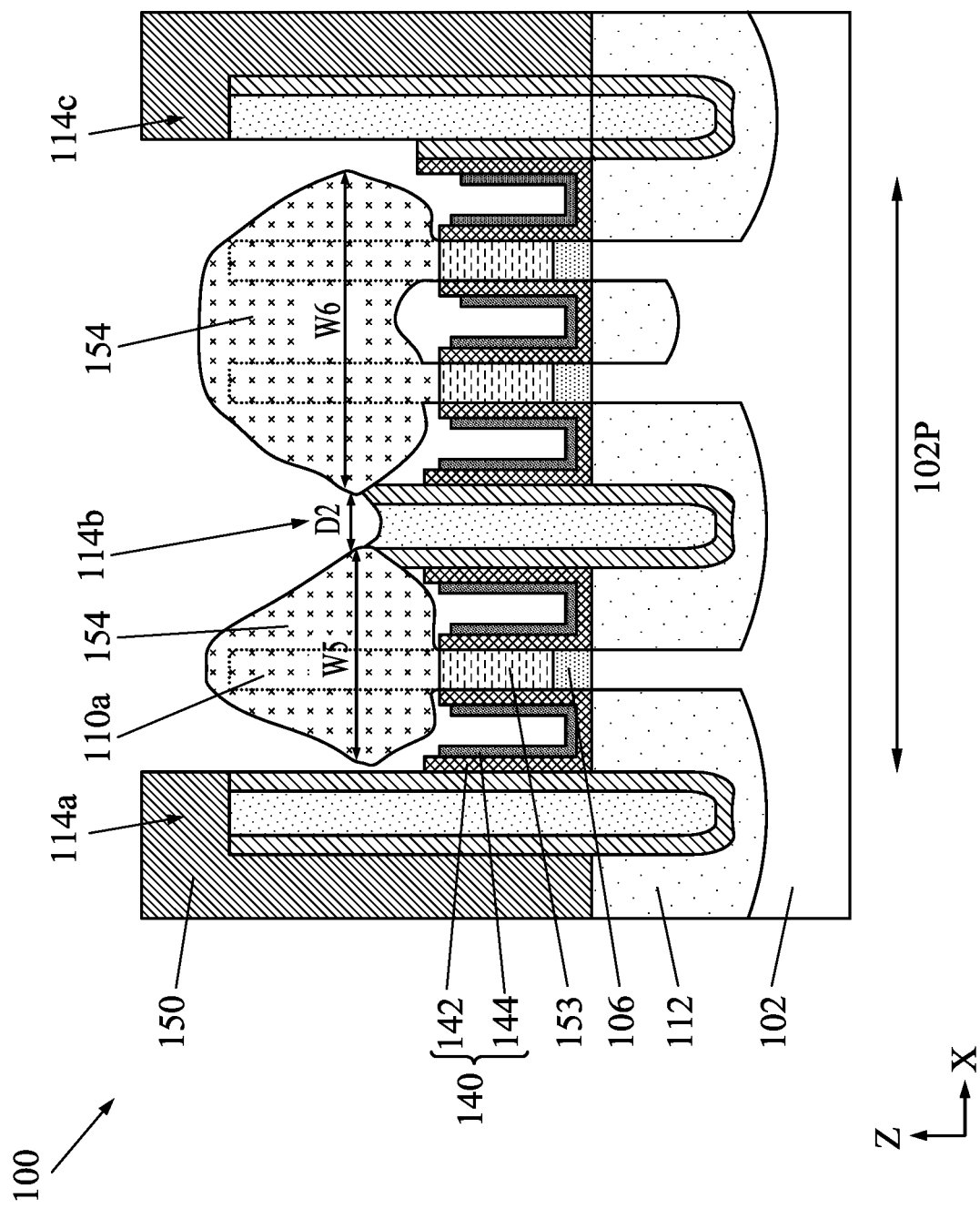
FIG. 8 is a cross-sectional side view of one of various stages of manufacturing the semiconductor device structure, in accordance with some embodiments.

FIG. 8 is a cross-sectional side view of one of various stages of manufacturing the semiconductor device structure 100, in accordance with some embodiments. FIG. 8 illustrates the S/D epitaxial features 154 in the PMOS region 102P according to some embodiments. As shown in FIG. 8, the portions of the spacer 140 located on the insulating material 112 are not removed as a result of being at a bottom of openings, which may be difficult for the etchant to reach, in some embodiments. Due to the recessed dielectric feature 114b, the S/D epitaxial feature 154 may be asymmetric with respect to the fin 110a (located under the sacrificial gate stack 128 and is shown in dotted line) along the Y axis. The single S/D epitaxial feature 154 has a width W5 ranging from about 35 nm to about 50 nm, and the merged S/D epitaxial features 154 has a width W6 ranging from about 50 nm to about 80 nm. In some embodiments, the ratio of the width W6 to the width W5 ranges from about 1.5 to about 2.5. In some embodiments, a distance D2 between the single S/D epitaxial feature 154 and the merged S/D epitaxial feature 154 ranges from about 10 nm to about 20 nm. In some embodiments, the distance D2 is substantially less than the distance D1 (FIG. 6). For example, the difference between the distance D1 and the distance D2 ranges from about 1 nm to about 5 nm. By recessing the dielectric feature 114b, the distance D2 is reduced, and the widths W5 and W6 are increased, leading to increased metal landing area.

Figure 9B:
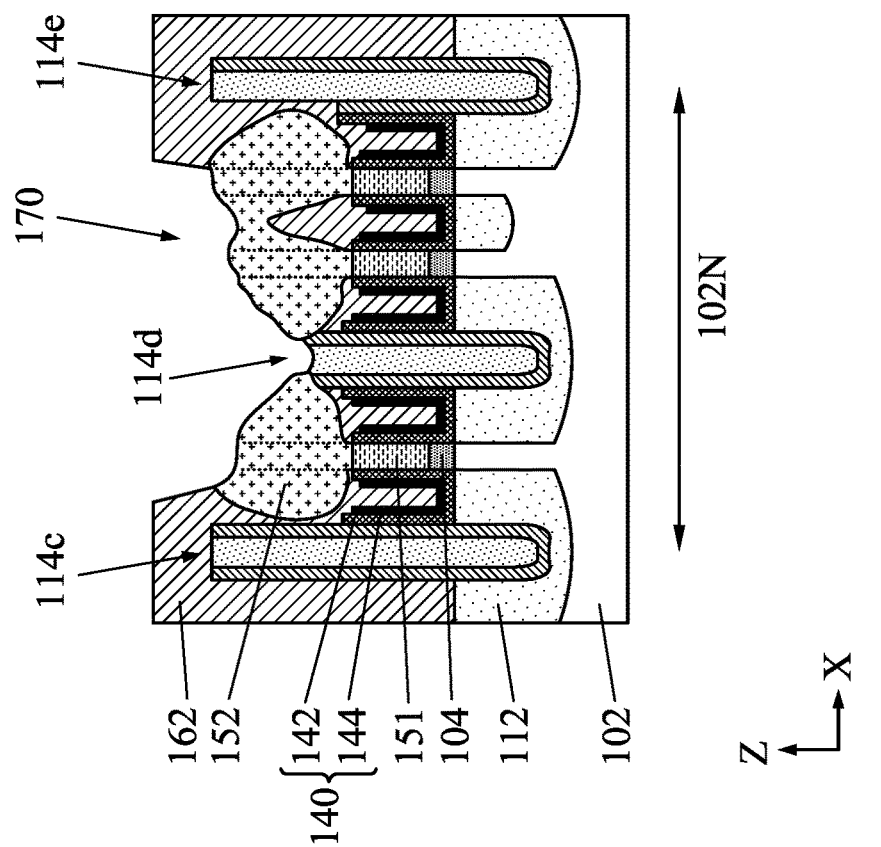
FIGS. 9A and 9B are cross-sectional side views of one of various stages of manufacturing the semiconductor device structures of FIG. 8 and FIG. 6, respectively, in accordance with some embodiments.
Figure 9A:
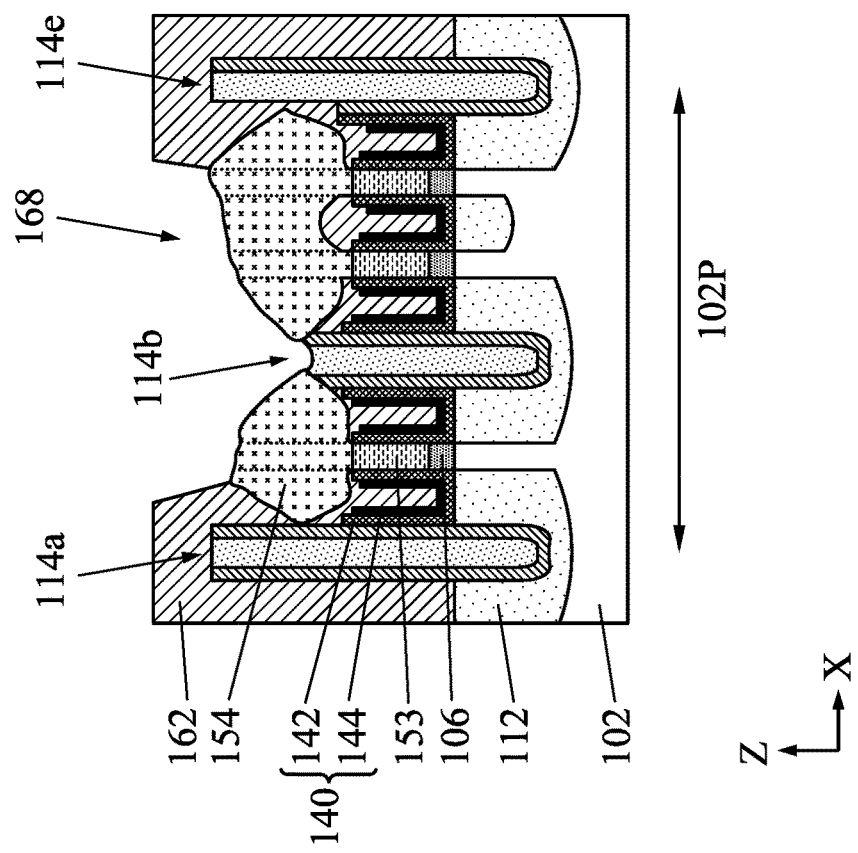

FIGS. 9A and 9B are cross-sectional side views of one of various stages of manufacturing the semiconductor device structures 100 of FIG. 8 and FIG. 6, respectively, in accordance with some embodiments. As shown in FIGS. 9A and 9B, which illustrate the S/D epitaxial features 154 in the PMOS region 102P and the S/D epitaxial features 152 in the NMOS region 102N, respectively, the mask 150 is removed, a contact etch stop layer (CESL) (not shown) may be formed on the S/D epitaxial features 154, 152 and the dielectric features 114a-e, and an interlayer dielectric (ILD) layer 162 is be formed on the CESL. The CESL may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL may be formed by CVD, PECVD, ALD, or any suitable deposition technique. The ILD layer 162 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique. In some embodiments, after formation of the ILD layer 162, the semiconductor device structure 100 may be subject to a thermal process to anneal the ILD layer 162.

Next, replacement gate process may be performed to replace the sacrificial gate stacks 128 (FIG. 7A) with gate stacks (not shown) including gate dielectric layers and gate electrode layers. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the ILD layer 162. The gate dielectric layer may include one or more dielectric layers and may include the same material(s) as the sacrificial gate dielectric layer 130. In some embodiments, the gate dielectric layers may be deposited by one or more ALD processes or other suitable processes. The gate electrode layer includes one or more layers of electrically conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers may be formed by PVD, CVD, ALD, electro-plating, or other suitable method. The gate electrode layers may be recessed to a level below the top surface of the ILD layer 162, and a self-aligned contact (SAC) layer (not shown) may be formed on each gate electrode layer.

Next, as shown in FIGS. 9A and 9B, portions of the ILD layer 162 and the CESL are removed to form openings 168, 170. The opening 168 exposes the S/D epitaxial features 154 and the dielectric feature 114b, and the opening 170 exposes the S/D epitaxial features 152 and the dielectric feature 114d. In some embodiments, the opening 168 is formed first, and an implantation process may be performed on the exposed S/D epitaxial features 154 to implant germanium dopant and boron dopant into the S/D epitaxial features 154.

Figure 10B:
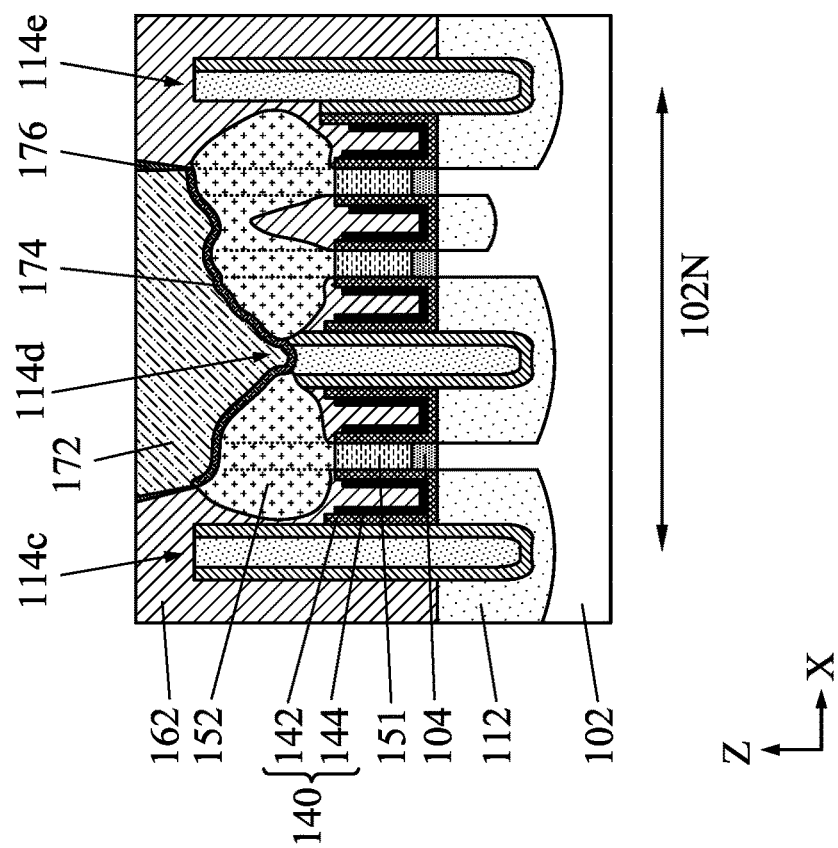
FIGS. 10A and 10B are cross-sectional side views of one of various stages of manufacturing the semiconductor device structures of FIG. 8 and FIG. 6, respectively, in accordance with some embodiments.
Figure 10A:
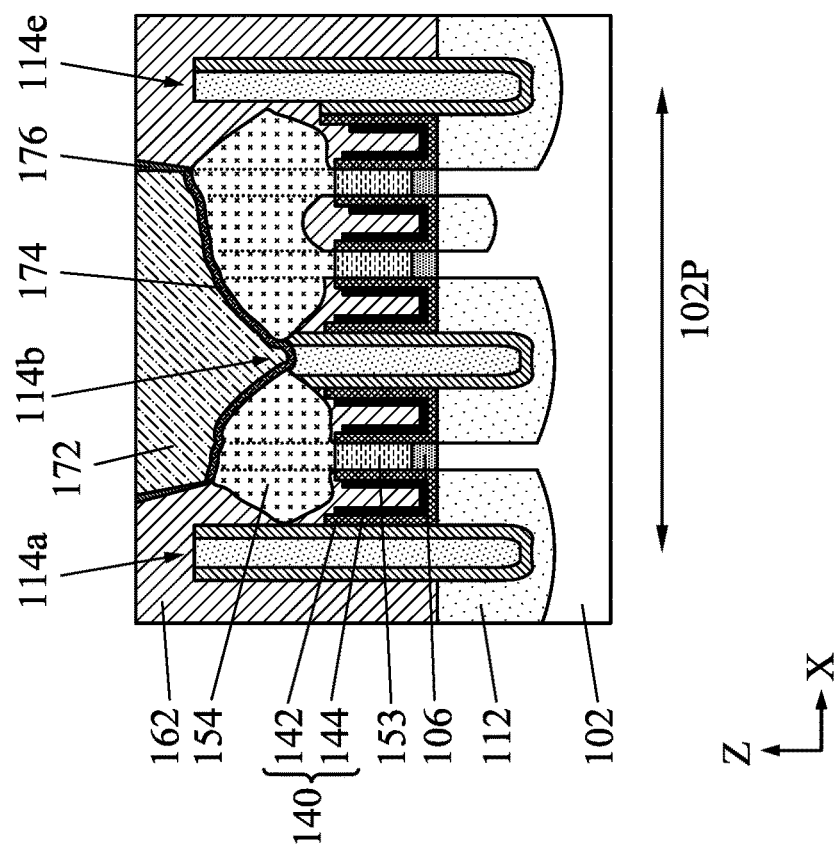

As shown in FIGS. 10A and 10B, the conductive features 172 are formed in the openings 168, 170. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. A silicide layer 174 may be formed between each S/D epitaxial feature 152, 154 and the conductive features 172, as shown in FIGS. 10A and 10B. The silicide layer 174 may be also formed between each dielectric feature 114b, 114d and the conductive features 172. The silicide layer 174 may include one or more of WSi, CoSi, NiSi, TiSi, MoSi or TaSi. A liner 176 may be disposed between the conductive features 172 and the ILD layer 162. The liner 176 may be a nitride, such as TiN. As described above, by reducing the distances D1 and D2, the widths of the S/D epitaxial features 152, 154 are increased, and the contact area between the conductive feature 172 and the S/D epitaxial features 152 (or S/D epitaxial feature 154) is increased. As a result, electrical resistance is reduced.

Figure 11A:
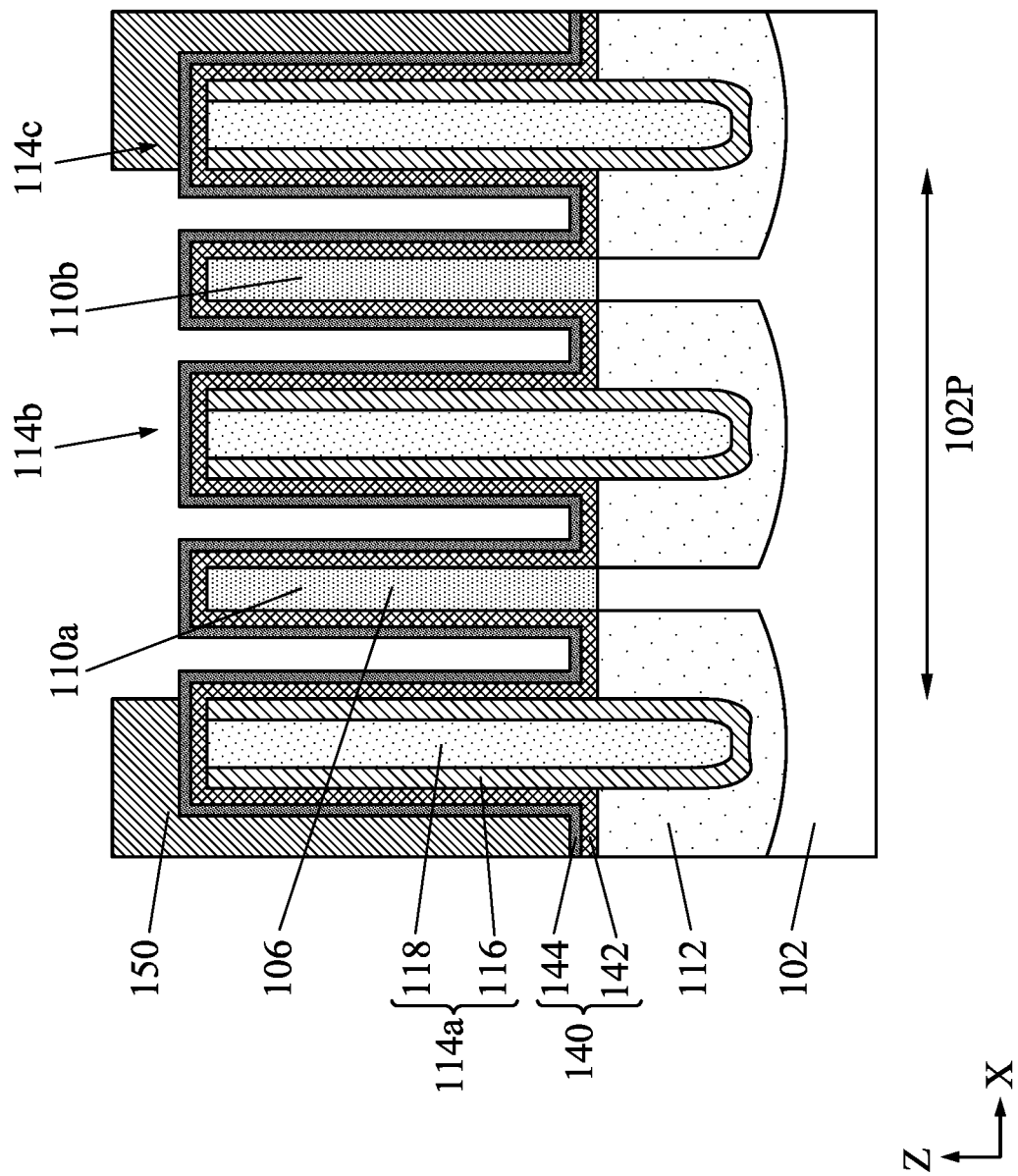
FIGS. 11A-11G are cross-sectional side views of various stages of manufacturing the semiconductor device structure, in accordance with some embodiments.

FIGS. 11A-11G are cross-sectional side views of various stages of manufacturing the semiconductor device structure 100, in accordance with some embodiments. As shown in FIG. 11A, the insulating material 112 is formed over the substrate 102 in the PMOS region 102P, and the fins 110a, 110b extends from the insulating material 112. The sacrificial gate stacks 128 (not shown) are disposed on portions of the fins 110a, 110b and the dielectric features 114a-c. The fins 110a, 110b includes the second semiconductor layer 106. The fins 110a, 110b are separated by the dielectric feature 114b, which includes the liner 116 and the low-K dielectric material 118. The fin 110a is disposed between the dielectric features 114a, 114b, and the fin 110b is disposed between the dielectric features 114b, 114c. The spacer 140 is disposed on the dielectric features 114a-c and the fins 110a, 110b. In some embodiments, the spacer 140 includes the first layer 142 and the second layer 144. The mask 150 is disposed on a portion of the dielectric features 114a, 114c, and the dielectric feature 114b and the fins 110a, 110b are exposed. In some embodiments, the anisotropic etch process described in FIGS. 3A and 3B are omitted.

Figure 11B:
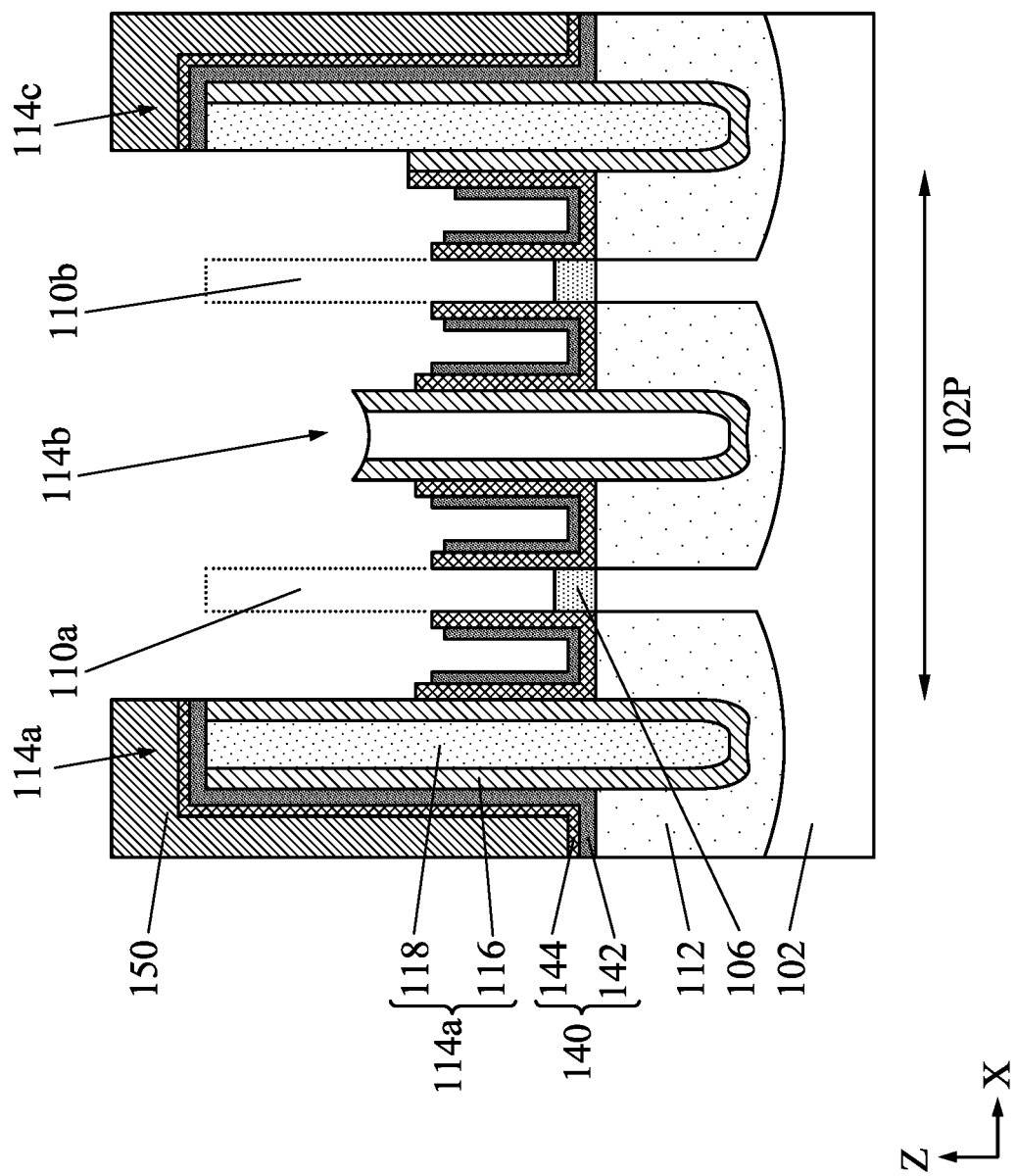

Next, as shown in FIG. 11B, multiple etch processes are performed to recess the exposed portions of the spacer 140, the fins 110a, 110b, and the dielectric feature 114b. The etch processes may be the same etch processes described in FIG. 7B, and the dimensions of the spacer 140, the fins 110a, 110b, and the dielectric feature 114b may be substantially the same as the dimensions of the spacer 140, the fins 110a, 110b, and the dielectric feature 114b shown in FIG. 7B. The remaining portions of the fins 110a, 110b are located under the sacrificial gate stacks 128 (not shown) and are shown in dotted lines.

Figure 11C:
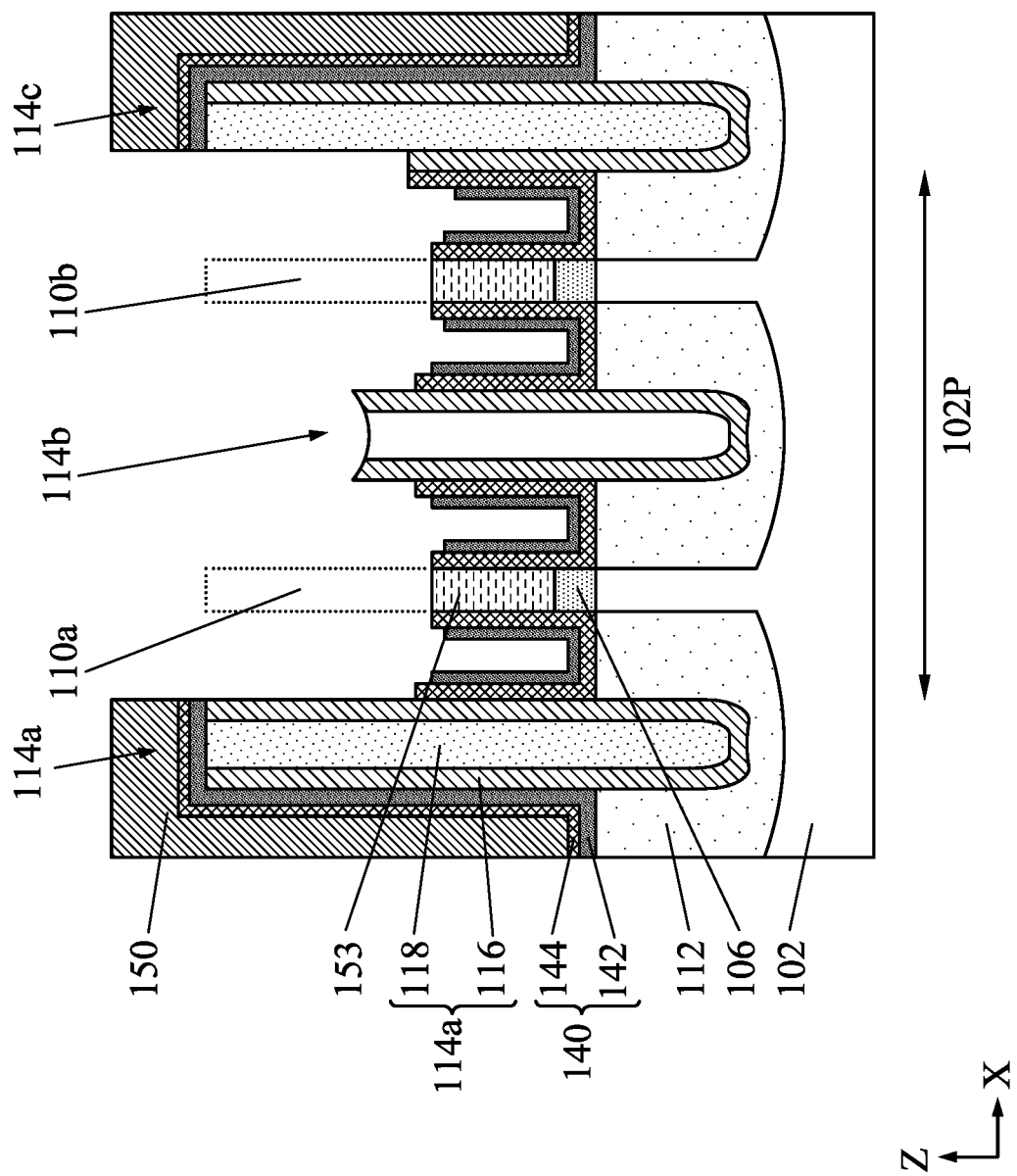
Figure 11D:
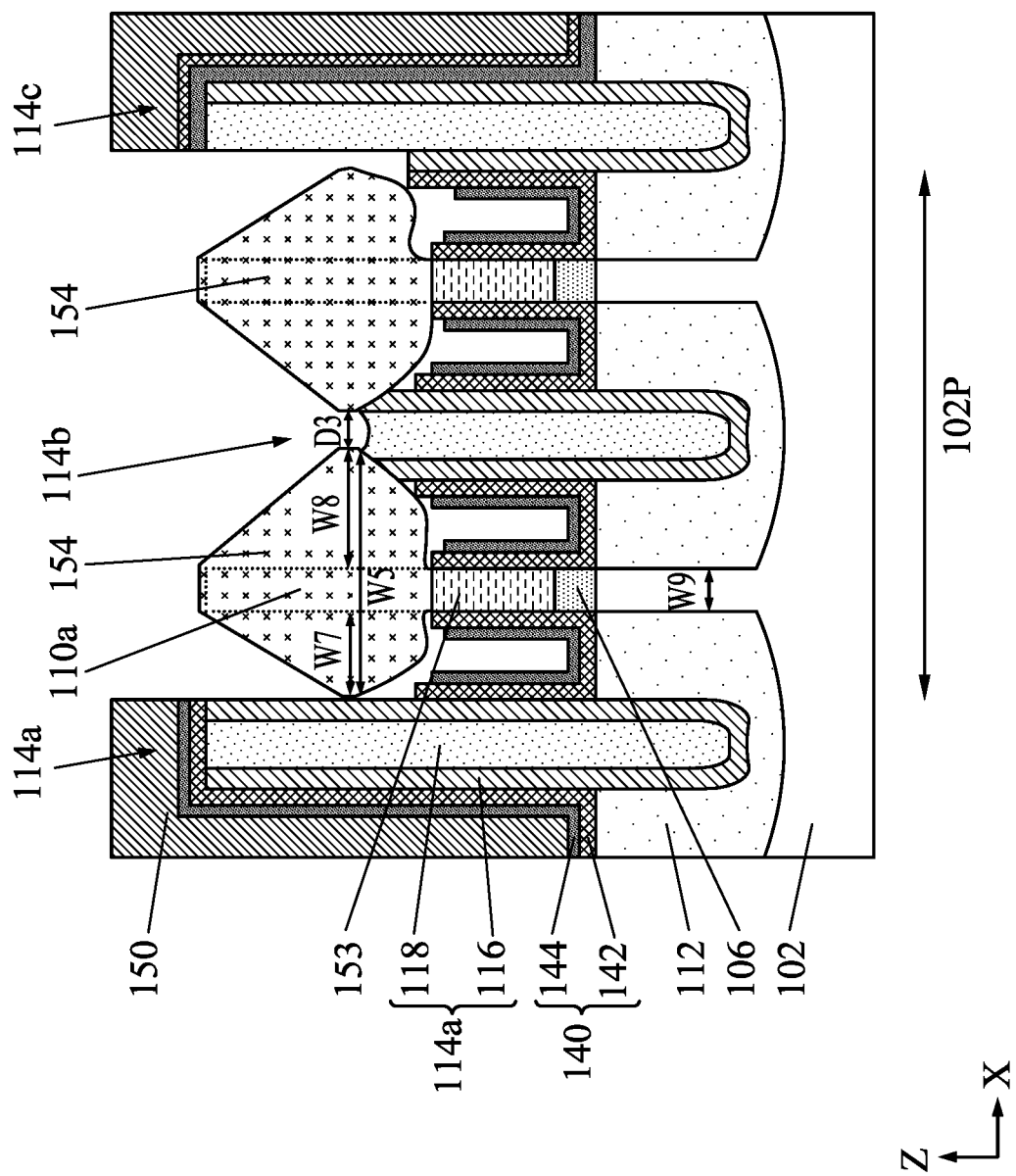

Next, as shown in FIG. 11C, the lightly doped epitaxial layers 153 are formed from the second semiconductor layers 106. The S/D epitaxial features 154 are formed from the lightly doped epitaxial layers 153, as shown in FIG. 11D. As described above, the S/D epitaxial feature 154 may be asymmetric with respect to the fin 110a (located under the sacrificial gate stack 128 and is shown in dotted line) along the Y axis. In some embodiments, the S/D epitaxial feature 154 has the width W5 ranging from about 35 nm to about 50 nm. The portion of the S/D epitaxial feature 154 next to the dielectric feature 114a has a width W7, and the portion of the S/D epitaxial feature 154 next to the dielectric feature 114b has a width W8. Because the dielectric feature 114b is recessed, the width W8 is substantially greater than the width W7. In some embodiments, the width W8 ranges from about 15 nm to about 25 nm, and the width W7 ranges from about 10 nm to about 20 nm. In some embodiments, the difference between the width W8 and the width W7 ranges from about 1 nm to about 5 nm. The fin 110a may have a width W9 of about 3 nm to about 10 nm. In some embodiments, a distance D3 between adjacent S/D epitaxial feature 154 ranges from about 5 nm to about 10 nm. The distance D3 may be less than or equal to the width W2 of the recessed dielectric feature 114d (FIG. 4B). In some embodiments, the distance D3 is substantially less than the distance D2 (FIG. 8). In some embodiments, the difference between the distance D3 and the distance D2 ranges from about 1 nm to about 5 nm.

Figure 11E:
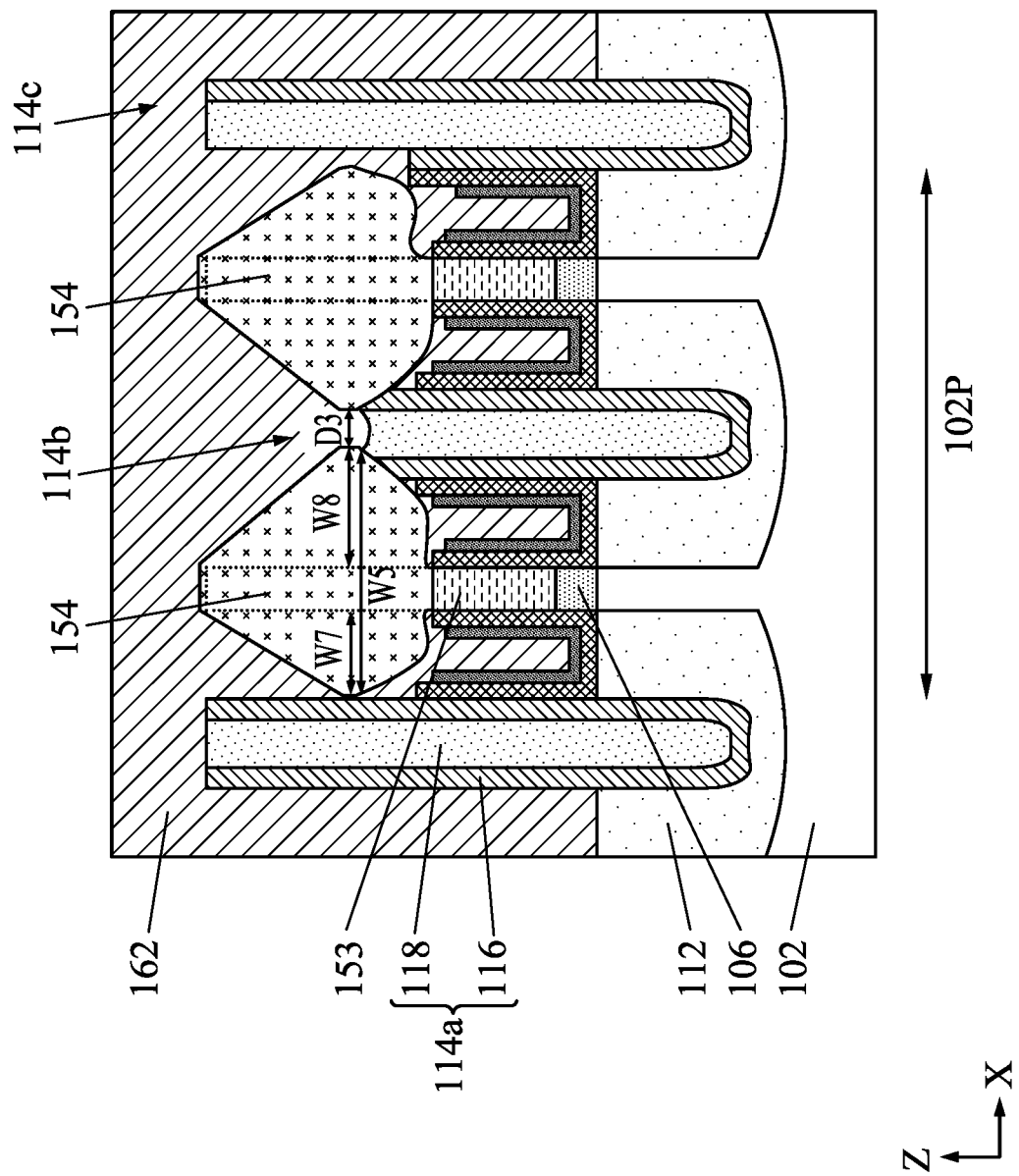
Figure 11F:
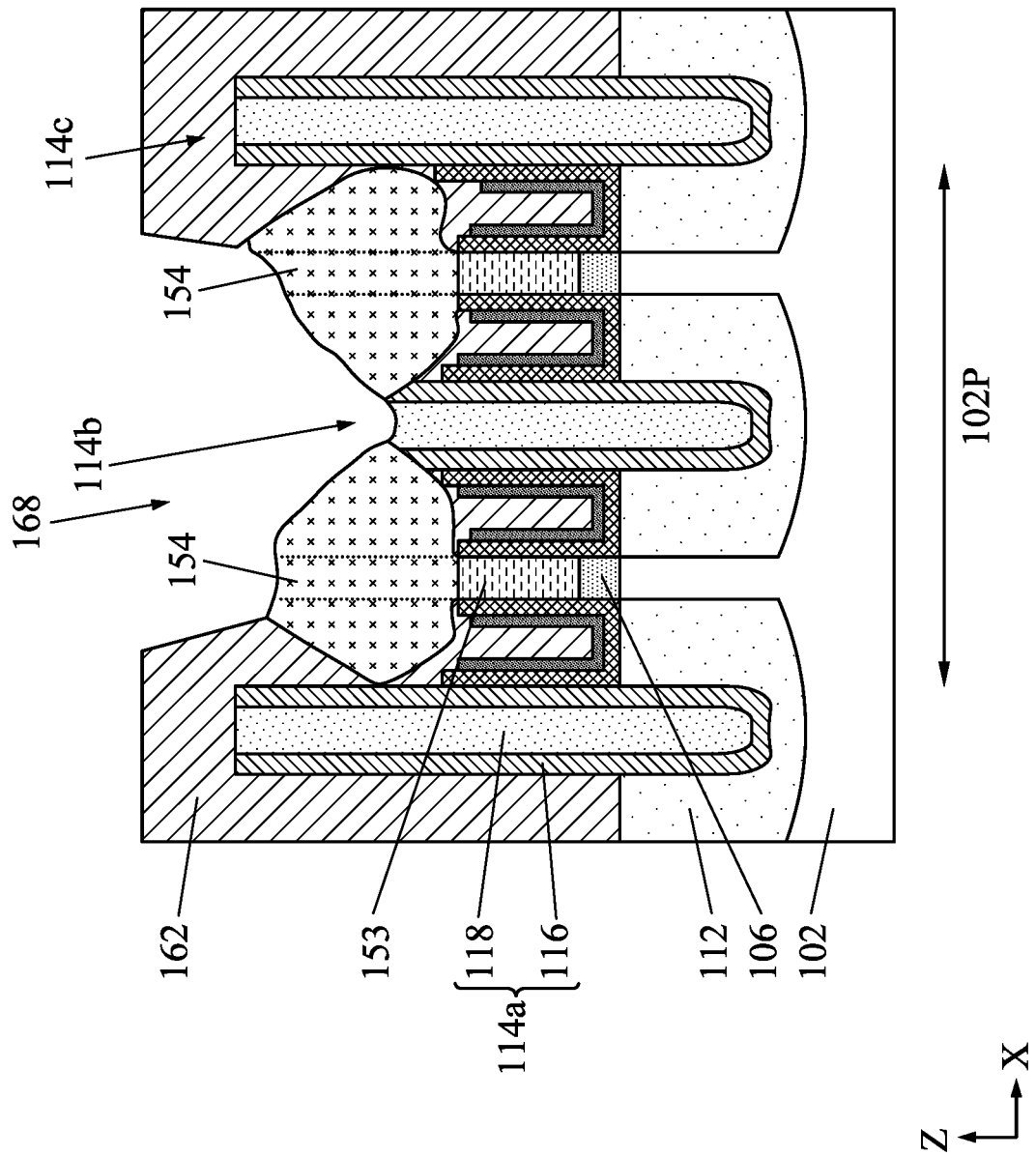
Figure 11G:
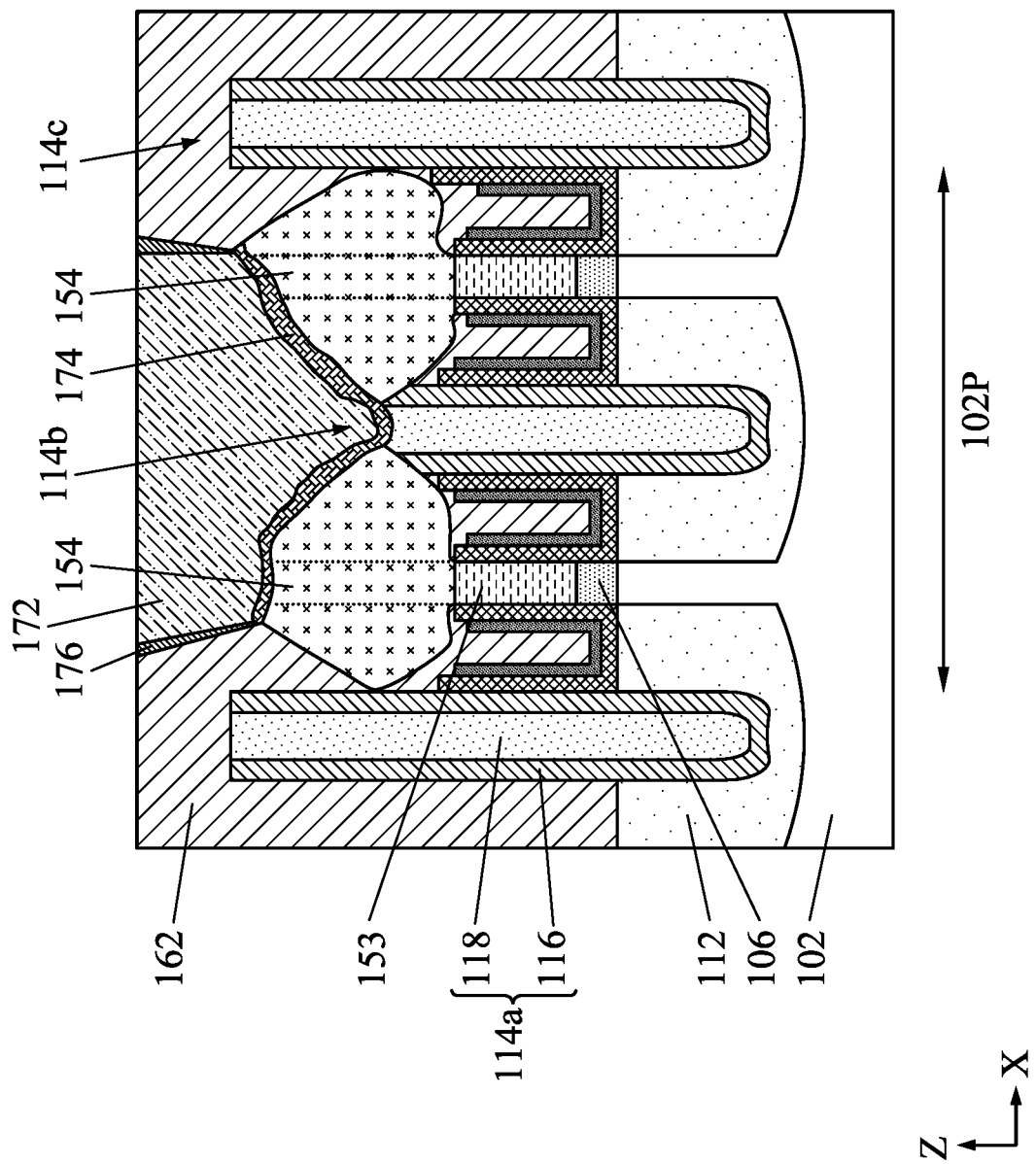

Next, as shown in FIG. 11E, the mask 150 and the portion of the spacer 140 not covered by the S/D epitaxial features 154 are removed, and the CESL (not shown) and the ILD layer 162 are formed over the dielectric features 114a-c and the S/D epitaxial features 154. The opening 168 is then formed in the ILD layer 162 and the CESL to expose the S/D epitaxial features 154 and the dielectric feature 114b, as shown in FIG. 11F. Next, as shown in FIG. 11G, the conductive feature 172, the silicide layer 174, and the liner 176 are formed in the opening 168.

The present disclosure provides a semiconductor device structure 100 including a dielectric feature 114b between S/D epitaxial features 154 and a conductive feature 172 disposed over the S/D epitaxial features 154 and the dielectric feature 114b. The dielectric feature 114b are recessed to less than 50 percent of its height in order to prevent adjacent S/D epitaxial features 154 from unintentionally merging while allowing more contact area for the conductive feature 172 over the S/D epitaxial features 154. Some embodiments may achieve advantages. For example, the increased contact area of the conductive feature 172 over the S/D epitaxial features 154 reduces contact resistance.

An embodiment is a semiconductor device structure. The semiconductor device structure includes a first source/drain epitaxial feature disposed in a first region, and the first source/drain epitaxial feature is asymmetric with respect to a fin. The structure further includes a second source/drain epitaxial feature disposed in the first region, a first dielectric feature disposed between the first source/drain epitaxial feature and the second source/drain epitaxial feature, and a conductive feature disposed over the first and second source/drain epitaxial features and the first dielectric feature.

Another embodiment is a semiconductor device structure. The semiconductor device structure includes a first source/drain epitaxial feature disposed in an NMOS region, and the first source/drain epitaxial feature is asymmetric with respect to a first fin. The structure further includes a second source/drain epitaxial feature disposed in the NMOS region, and the first source/drain epitaxial feature and the second source/drain epitaxial feature is a first distance apart. The structure further includes a first dielectric feature disposed between the first source/drain epitaxial feature and the second source/drain epitaxial feature and a third source/drain epitaxial feature disposed in a PMOS region. The third source/drain epitaxial feature is asymmetric with respect to a second fin. The structure further includes a fourth source/drain epitaxial feature disposed in the PMOS region, and the third source/drain epitaxial feature and the fourth source/drain epitaxial feature is a second distance apart. The first distance is substantially greater than the second distance. The structure further includes a second dielectric feature disposed between the third source/drain epitaxial feature and the fourth source/drain epitaxial feature.

A further embodiment is a method. The method includes forming first and second semiconductor fins and forming first, second, and third dielectric features. The first semiconductor fin is disposed between the first and second dielectric features, and the second semiconductor fin is disposed between the second and third dielectric features. The method further includes forming a mask on the first and third dielectric features, recessing the first and second semiconductor fins by a first etch process, recessing the second dielectric feature by a second etch process, and forming a first source/drain epitaxial feature over the recessed first semiconductor fin and a second source/drain epitaxial feature over the recessed second semiconductor fin. The first source/drain epitaxial feature is asymmetric with respect to the first semiconductor fin. The method further includes forming a conductive feature over the first and second source/drain epitaxial features and the second dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming first and second semiconductor fins;
   forming first, second, and third dielectric features, wherein the first semiconductor fin is disposed between the first and second dielectric features, and the second semiconductor fin is disposed between the second and third dielectric features;
   forming a mask on the first and third dielectric features;
   recessing the first and second semiconductor fins by a first etch process;
   recessing the second dielectric feature by a second etch process;
   forming a first source/drain epitaxial feature over the recessed first semiconductor fin and a second source/drain epitaxial feature over the recessed second semiconductor fin, wherein the first source/drain epitaxial feature is asymmetric with respect to the first semiconductor fin; and
   forming a conductive feature over the first and second source/drain epitaxial features and the second dielectric feature.

2. The method of claim 1, further comprising forming a spacer on the first and second semiconductor fins and the first, second, and third dielectric features.

3. The method of claim 2, further comprising recessing the spacer by a third etch process.

4. The method of claim 3, further comprising forming an interlayer dielectric layer on the first and second source/drain epitaxial features and the first, second, and third dielectric features, wherein the conductive feature is formed in the interlayer dielectric layer.

5. The method of claim 4, further comprising forming a silicide layer on the first and second source/drain epitaxial features and on the second dielectric feature, wherein the conductive feature is formed on the silicide layer.

6. A method for forming a semiconductor device structure, comprising:
   forming first and second fins;
   forming a dielectric feature between the first and second fins, wherein the dielectric feature has a first height;
   recessing the first and second fins by a first selective etch process;
   recessing the dielectric feature by a second selective etch process, wherein an amount of the dielectric feature being recessed has a second height less than about 50 percent of the first height;
   forming a first source/drain epitaxial feature over the recessed first fin and a second source/drain epitaxial feature over the recessed second fin; and
   forming a conductive feature over the first and second source/drain epitaxial features and the dielectric feature.

7. The method of claim 6, further comprising depositing a first layer around the first and second fins and the dielectric feature.

8. The method of claim 7, further comprising depositing a second layer on the first layer.

9. The method of claim 8, further comprising recessing the first and second layers by a third selective etch process.

10. The method of claim 9, wherein the first layers is recessed to a third height and the second layer is recessed to a fourth height different from the third height.

11. The method of claim 10, wherein the third height is greater than the fourth height.

12. The method of claim 6, wherein the dielectric feature comprises a liner and a low-K dielectric material disposed on the liner.

13. The method of claim 12, wherein the liner comprises a first portion and a second portion located over the first portion.

14. The method of claim 13, wherein the first portion has a thickness greater than a thickness of the second portion after the recessing of the dielectric feature.

15. A method for forming a semiconductor device structure, comprising:
   forming first and second fins;
   forming a dielectric feature between the first and second fins, wherein the dielectric feature has a first width, and the dielectric feature comprises a liner and a low-K dielectric material;
   recessing the first and second fins by a first selective etch process;
   recessing the dielectric feature by a second selective etch process, wherein a top portion of the dielectric feature has a second width less than the first width;
   forming a first source/drain epitaxial feature over the recessed first fin and a second source/drain epitaxial feature over the recessed second fin; and
   forming a conductive feature over the first and second source/drain epitaxial features and the dielectric feature.

16. The method of claim 15, wherein the second selective etch process reduces a thickness of the top portion of the liner.

17. The method of claim 16, wherein the second selective etch process reduces a height of the dielectric feature.

18. The method of claim 15, wherein the dielectric feature separates the first and second source/drain epitaxial features.

19. The method of claim 15, further comprising forming a silicide layer on the first and second source/drain epitaxial features and the dielectric feature, wherein the conductive feature is formed on the silicide layer.

20. The method of claim 15, wherein the second selective etch process reduces a height of the dielectric feature.

* * * * *